(12) United States Patent
Guler et al.

(10) Patent No.: US 12,720,854 B2
(45) Date of Patent: Aug. 25, 2026

(54) INTEGRATED CIRCUIT STRUCTURES HAVING GATE CUT PLUG REMOVED FROM TRENCH CONTACT USING ANGLED DIRECTIONAL ETCH

(71) Applicant: Intel Corporation, Santa Clara, CA (US)

(72) Inventors: Leonard P. Guler, Hillsboro, OR (US); Ala Alazizi, Portland, OR (US); Tsuan-Chung Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 17/949,861

(22) Filed: Sep. 21, 2022

(65) Prior Publication Data

US 2024/0096881 A1 Mar. 21, 2024

(51) Int. Cl.

| | |
|---|---|
| ***H01L 27/088*** | (2006.01) |
| ***H01L 29/06*** | (2006.01) |
| ***H01L 29/423*** | (2006.01) |
| ***H01L 29/66*** | (2006.01) |
| ***H01L 29/786*** | (2006.01) |
| ***H10D 30/67*** | (2025.01) |
| ***H10D 62/10*** | (2025.01) |
| ***H10D 64/01*** | (2025.01) |
| ***H10D 84/83*** | (2025.01) |

(52) U.S. Cl.

CPC ....... *H10D 84/834* (2025.01); *H10D 30/6735* (2025.01); *H10D 30/6757* (2025.01); *H10D 62/121* (2025.01); *H10D 64/021* (2025.01)

(58) Field of Classification Search

CPC .... H10D 30/014; H10D 30/024; H10D 30/43; H10D 30/62; H10D 30/6211; H10D 30/6212; H10D 30/6213; H10D 30/6735; H10D 30/6757; H10D 64/015; H10D 64/018; H10D 64/021; H10D 64/118; H10D 64/119; H10D 64/121; H10D 84/0135; H10D 84/0149; H10D 84/0151; H10D 84/0153; H10D 84/0158; H10D 84/0193; H10D 84/834; H10D 84/853

See application file for complete search history.

(56) References Cited

U.S. PATENT DOCUMENTS

| | | | | |
|---|---|---|---|---|
| 2022/0328496 | A1* | 10/2022 | Kang | H10B 10/125 |
| 2023/0034360 | A1* | 2/2023 | Su | H10D 30/014 |
| 2023/0066387 | A1* | 3/2023 | Chen | H10D 30/6757 |
| 2023/0411490 | A1* | 12/2023 | Wang | H10D 84/83 |

* cited by examiner

*Primary Examiner* — David C Spalla

(74) *Attorney, Agent, or Firm* — Schwabe, Williamson & Wyatt P.C.

(57) ABSTRACT

Integrated circuit structures having gate cut plugs removed from trench contacts, and methods of fabricating integrated circuit structures having gate cut plugs removed from trench contacts, are described. For example, an integrated circuit structure includes a vertical stack of horizontal nanowires. A gate electrode is over the vertical stack of horizontal nanowires. A conductive trench contact is adjacent to the gate electrode. A dielectric sidewall spacer is between the gate electrode and the conductive trench contact. A gate cut plug extends through the gate electrode and the dielectric sidewall spacer. The gate cut plug extends to and is conformal with a side of the conductive trench contact.

16 Claims, 19 Drawing Sheets

300
312
314
310
308
306
304
305
302
350
362
364
380
310
358
354
356
360
355
352

570
588
587
578
576
580
588
587
580
587
588
584
580
587
588

550
568
567
564
558
556
560
567
568

500
517
517
514
518
508
506
510
518

INTEGRATED CIRCUIT STRUCTURES HAVING GATE CUT PLUG REMOVED FROM TRENCH CONTACT USING ANGLED DIRECTIONAL ETCH

TECHNICAL FIELD

Embodiments of the disclosure are in the field of integrated circuit structures and processing and, in particular, integrated circuit structures having gate cut plugs removed from trench contacts and methods of fabricating integrated circuit structures having gate cut plugs removed from trench contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

DESCRIPTION OF THE EMBODIMENTS

Figure 1A:
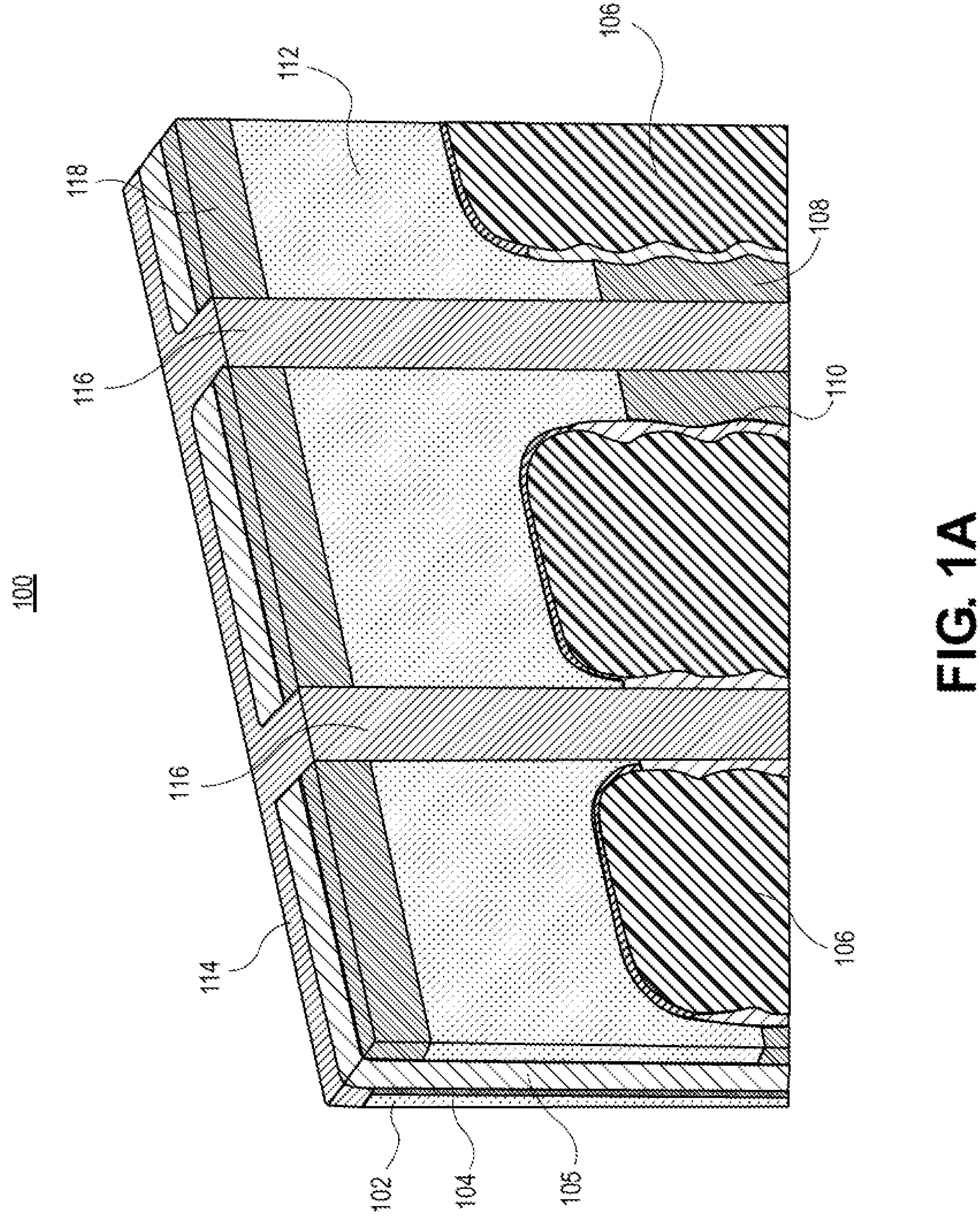
FIGS. 1A-1D illustrate angled cross-sectional views and a plan view representing various operations in methods of fabricating an integrated circuit structure having a gate cut plug removed from a trench contact, in accordance with an embodiment of the present disclosure.

Integrated circuit structures having gate cut plugs removed from trench contacts, and methods of fabricating integrated circuit structures having gate cut plugs removed from trench contacts, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as “upper”, “lower”, “above”, and “below” refer to directions in the drawings to which reference is made. Terms such as “front”, “back”, “rear”, and “side” describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to integrated circuit structures fabricated using a dimensional modification etch for metal gate cut (MGC) trench contact (TCN) plug removal. One or more embodiments described herein are directed to gate-all-around devices fabricated using a dimensional modification etch for metal gate cut (MGC) trench contact (TCN) plug removal. It is to be appreciated that, unless indicated otherwise, reference to nanowires herein can indicate nanowires or nanoribbons. One or more embodiments described herein are directed to FinFET structures fabricated using a dimensional modification etch for metal gate cut (MGC) trench contact (TCN) plug removal. One or more embodiments described herein are directed to cut work function metals for gate end-to-end isolation.

To provide context, complex processing schemes can be used to effectively remove metal gate cut (MGC) plugs added during trench contact (TCN) plug patterning to reestablish continuity in a gate metal. Such an approach can involve a lithography pass, multiple depositions of sacrificial layers, etch, and cleans which is costly and can introduce more variation. In accordance with one or more embodiments of the present disclosure, such an approach is avoided in order to improve robustness and simplify a MGC plug removal process. Advantages for implementing embodiments disclosed herein can include reduction in process cost and an increase in robustness (e.g., self-aligned removal of the plug can provide maximum process margin).

In accordance with one or more embodiments of the present disclosure, a directional etch tool using an angled plasma beam is implemented to etch the MGC plugs by shrinking them from the sides with little impact to the grating height and CD in the opposite direction. To do this with a conventional orthogonal plasma etcher, lithography masks and sacrificial layers may otherwise be needed to cover the areas that need to be maintained and only keep the plugs exposed. Accordingly, in an embodiment, an additional lithography mask can be skipped by removing the plug directly from MGC using angled plasma beam that etches the plugs from the sides.

Detection of the implementation of embodiments described herein can include the observation that plug removal is aligned to the TCN trench. Detection of the implementation of embodiments described herein can include the observation that, due to the angled nature of the etch, there may be asymmetry at the bottom. Detection of the implementation of embodiments described herein can include reverse engineering to reveal that the plug was removed post patterning with an angled plasma beam due to a metal gate cut plug remnant.

In an embodiment, a TCN plug can be maintained while MGC plugs can be removed by patterning around MGC plugs only, e.g., by depositing a helmet to protect TCN gratings and plugs. The exposed plugs can then be exposed to angled directional beam plasma etch and removed.

As an exemplary processing scheme, FIGS. 1A-1D illustrate angled cross-sectional views and a plan view representing various operations in methods of fabricating an integrated circuit structure having a gate cut plug removed from a trench contact, in accordance with an embodiment of the present disclosure. It is to be appreciated that the embodiments described and illustrated may also be applicable for a fin structure in place of a stack of nanowires or nanoribbons or nanosheets.

Referring to FIG. 1A, a starting structure 100 is shown after metal gate cut and trench contact recess processes. Starting structure 100 includes a gate electrode 102, such as a metal gate electrode, and a gate dielectric layer 104, such as a high-k gate dielectric layer. A dielectric gate cap 114, such as a silicon nitride dielectric gate cap, is included on the gate electrode 102 and gate dielectric layer 104. Dielectric sidewall spacers 105 (one shown), such as silicon nitride or carbon-doped silicon nitride spacers, are along sides of the gate electrode 102, gate dielectric layer 104, and dielectric gate cap 114. Although not viewable from this perspective, the gate structure is over one or more pluralities of horizontally stacked nanowires (or nanoribbons or nanosheets, or, alternatively, one or more fins), such as silicon nanowires, examples of which are described below.

Referring again to FIG. 1A, epitaxial source or drain structures 106, such as epitaxial silicon or silicon germanium source or drain structures, are laterally adjacent to the dielectric sidewall spacer 105. In one embodiment, each of the epitaxial source or drain structures 106 is at an end of a corresponding one of the pluralities of horizontally stacked nanowires (or at an end of a corresponding fin) covered by the gate electrode 102 and gate dielectric layer 104. It is to be appreciated that a corresponding epitaxial source or drain structure on an opposite end of the corresponding one of the pluralities of horizontally stacked nanowires is not viewable in this perspective (and would be into the page). An etch stop layer 110, such as a silicon nitride etch stop layer, can remain on lower portions of the epitaxial source or drain structures 106. In one embodiment, the etch stop layer 110 is continuous with the dielectric sidewall spacer 105. In other embodiments, the etch stop layer 110 is not continuous with the dielectric sidewall spacer 105. A dielectric fill 108, such as a silicon oxide or silicon dioxide fill, is adjacent to lower portions of the epitaxial source or drain structures 106.

Referring again to FIG. 1A, a conductive trench contact 112, such as a contact structure having a conductive liner and a tungsten (W) fill material, is over upper portions of the epitaxial source or drain structures 106. In one embodiment, the conductive trench contact 112 is recessed relative to the dielectric sidewall spacer 105, and an insulating trench contact cap 118, such as a silicon oxide or silicon dioxide layer, is formed on the conductive trench contact 112, as is depicted. Gate cut plugs 116, such as SiN, SiON, SiO, and/or SiC dielectric plugs, cut select locations of the gate electrode 102. However, in an embodiment, at this stage, the gate cut plugs can extend into and even completely isolate portions of the conductive trench contact 112, as is depicted. In one such, embodiment, one or more of the gate cut plugs 116 breaks the continuity of the trench contact 112 in a location that is intended to be electrically connected. In previous approaches, a next level interconnect could be used to electrically join two portions of a conductive trench contact 112 otherwise isolated by a gate cut plug 116 that extends into the conductive trench contact 112. Alternatively, in accordance with one or more embodiments of the present disclosure, a portion of the gate cut plug 116 is removed, such as described in association with FIGS. 1B-1D.

Figure 1B:
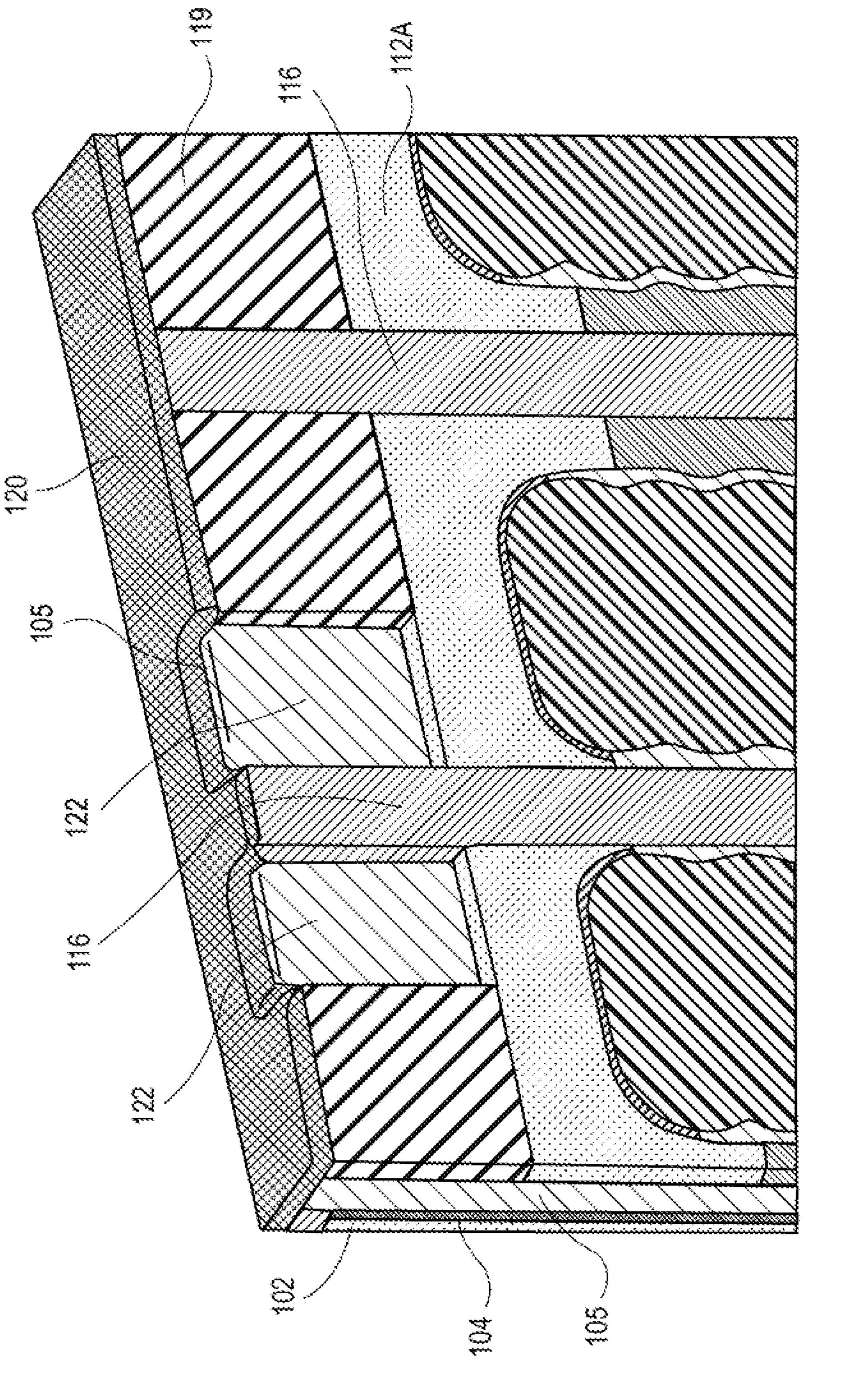

Referring to FIG. 1B, the insulating trench contact cap 118 is removed (if present) and the conductive trench contact 112 is recessed to form recessed conductive trench contact 112A. A patterning mask 119, such as a carbon-based hardmask, is formed in the recess on the recessed conductive trench contact 112A. Openings 122 are patterned in the patterning mask 119 in locations where a portion of a gate cut plug 116 is to be removed. A helmet layer 120, such as an amorphous silicon helmet layer, can then be formed on the resulting structure.

Figure 1C:
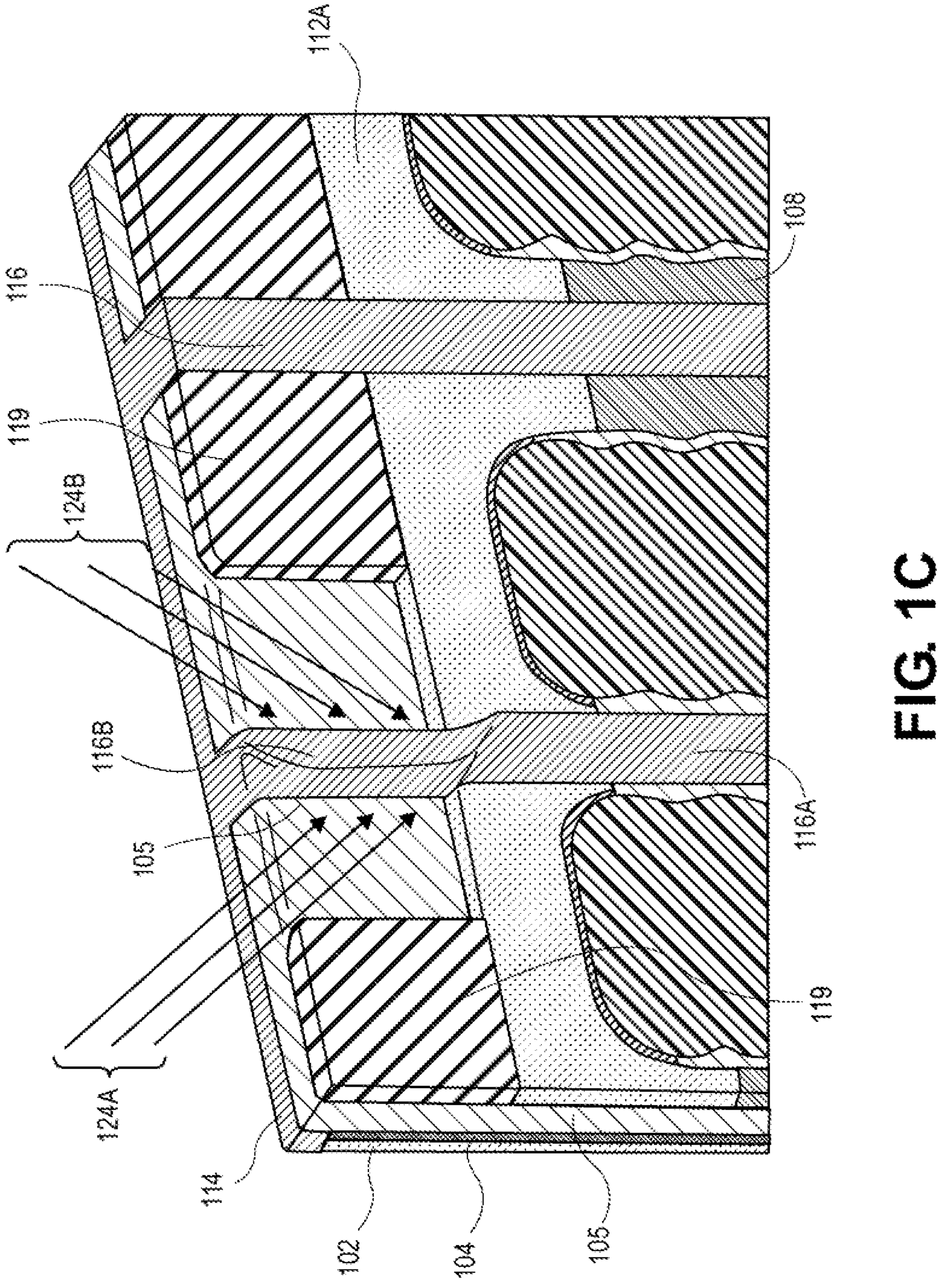

Referring to FIG. 1C, angled directional etches 124A and 124B are then performed in the openings 122. The angled directional etches 124A and 124B remove a portion of the gate cut plug 116 in the trench contact location to form a gate cut plug having a lower portion 116A that remains in the trench contact location, and an upper portion 116B that is recessed away from the trench contact location toward (and possibly parallel with) the dielectric sidewall spacer 105. In one embodiment, the lower portion 116A has an angled surface due to the use of the angled directional etches 124A and 124B in a sequential manner. In one embodiment, the helmet layer 120 is removed during the angled directional etches 124A and 124B, as is depicted.

Figure 1D:
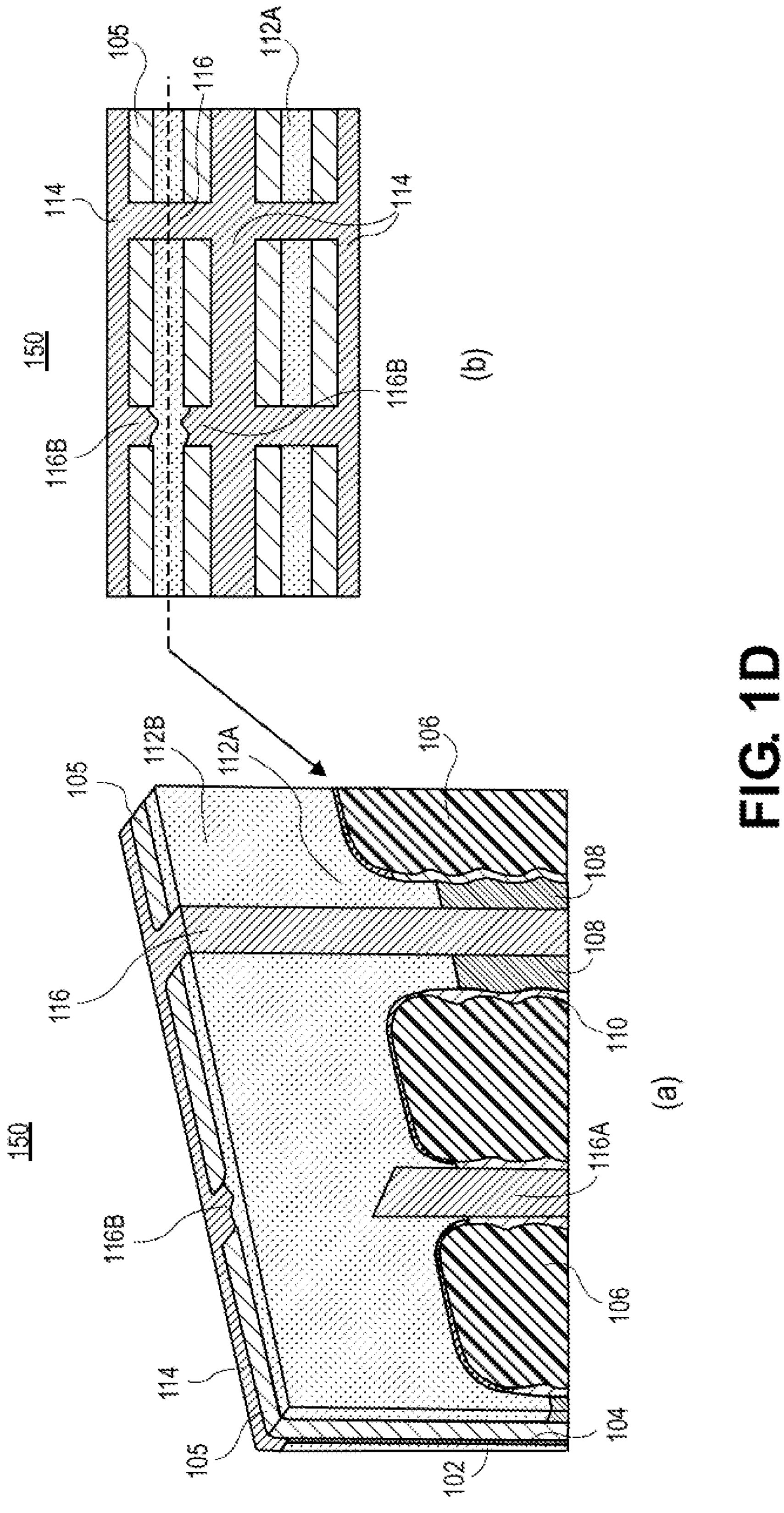

Referring to FIG. 1D, an angled cross-sectional view and a corresponding plan view of an integrated circuit structure 150 effectively includes a conductive trench contact reformed by depositing conductive trench contact material 112B on the recessed conductive trench contact 112A. However, since the upper portion of the left gate cut plug 116 was removed from the trench contact location to form upper portion 116B, the resulting conductive trench contact 112B/112A is electrically continuous over the left two epitaxial source or drain structures 106, in the location where it was initially isolated. The conductive trench contact material 112B is over the lower portion 116A of the modified gate cut plug in that location. The lower portion 116A of the modified gate cut plug can be referred to as a gate cut plug remnant which, in one embodiment, has an angled top surface, as is depicted. The upper portion 116B of the gate plug, i.e., the laterally recessed portion of the left gate cut plug, extends to and is conformal with the conductive trench contact material 112B. In one such embodiment, the upper portion 116B of the gate plug extends to and is conformal with a non-flat side of the conductive trench contact material 112B, as is depicted.

In another aspect, in order to reduce a cell height in a future or scaled technology node, both the gate endcap and gate cut size needs to shrink. Gate cut prior to gate metal fill can limit the effective end cap available for work function and can become challenging for metal fill capability in tighter space. The defect can be worse for any gate end-to-end mis-registration creating even smaller endcap space.

In accordance with one or more embodiments of the present disclosure, addressing issues outlined above, a metal gate cut process is implemented subsequent to completing gate dielectric and work function metal deposition and patterning. In any case, in an embodiment, gate plugs formed after metal gate formation ("plug-last") and/or gate plugs formed prior to metal gate formation ("plug-first"), both of which are described below, can be used for the gate plugs described above in association with FIGS. 1A-1D.

Advantages for implementing approaches described herein can include a so-called "plug-last" approach with a result that a gate dielectric layer (such as a high-k gate dielectric layer) is not deposited on a gate plug sidewall, effectively saving additional room for work function metal deposition. By contrast, a metal gate fill material can pinch between the plug and fin during a so-called conventional "plug-first" approach. The space for metal fill can be narrower due to plug mis-registration in the latter approach, and can result in voids during metal fill. In embodiments described herein, using a "plug-last" approach, a work function metal deposition can be seamless (e.g., void free).

In accordance with one or more embodiments of the present disclosure, an integrated circuit structure has a clean interface between a gate plug dielectric and a gate metal. It is to be appreciated that many embodiments can benefit from approaches described herein, such as plug-last approaches. For example, a metal gate cut on a FinFET device is described below in association with FIG. 2B. A metal gate cut scheme can be implemented for a gate-all-around (GAA) device, such as described below in association with FIGS. 3B and 4B. Additionally, a metal gate cut and plug formation may appear different based on the incoming structure. For example, the plug may land on a shallow trench isolation (STI) structure, such as described in association with FIGS. 2B and 3B, or may land on a pre-fabricated gate wall made of dielectric, such as described in association with FIG. 4B. A metal gate cut approach can be selective to a gate spacer dielectric, such as described in association with FIGS. 5B and 6B, or may not be selective to a gate spacer material, such as described in association with FIGS. 5C and 6C. A non-selective metal gate cut embodiment may need an alternate contact metal scheme to accommodate a dielectric plug between epi source/drain. The plug etch selectivity to epi source/drain material is optional. However, in one embodiment, if the epitaxial source/drain is exposed to a plug etch (e.g., due to device dimension), the etch can trim the source/drain anisotropically, such as described below in association with FIG. 5C. Such an approach may be implemented to achieve tight endcap spacing.

Figure 2B:
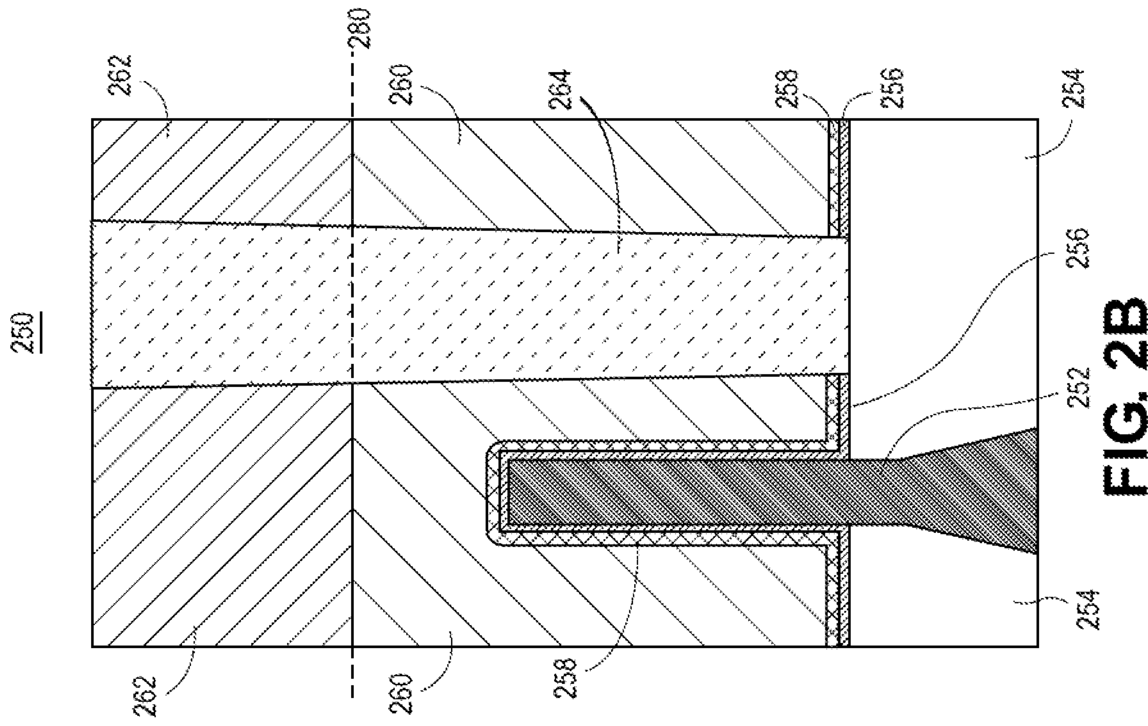
FIG. 2B illustrates a cross-sectional view of an integrated circuit structure having a fin and a cut metal gate dielectric plug, in accordance with an embodiment of the present disclosure.
Figure 2A:
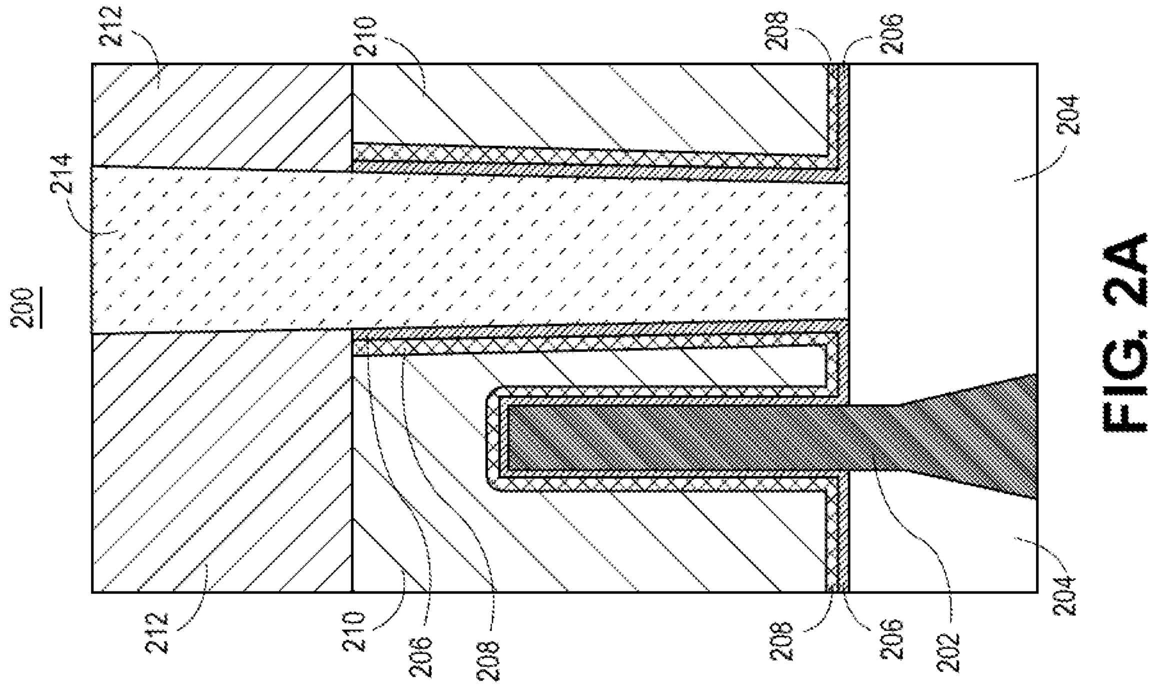
FIG. 2A illustrates a cross-sectional view of an integrated circuit structure having a fin and a pre-metal gate dielectric plug, in accordance with an embodiment of the present disclosure.

A dielectric gate plug can be fabricated for a FinFET device. As a comparative example, FIG. 2A illustrates a cross-sectional view of an integrated circuit structure having a fin and a pre-metal gate dielectric plug, in accordance with an embodiment of the present disclosure. FIG. 2B illustrates a cross-sectional view of an integrated circuit structure having a fin and a cut metal gate dielectric plug, in accordance with an embodiment of the present disclosure.

Referring to FIG. 2A, an integrated circuit structure 200 includes a fin 202 having a portion protruding above a shallow trench isolation (STI) structure 204. A gate dielectric material layer 206, such as a high-k gate dielectric layer, is over the protruding portion of the fin 202 and over the STI structure 204. It is to be appreciated that, although not depicted, an oxidized portion of the fin 202 may be between the protruding portion of the fin 202 and the gate dielectric material layer 206 and may be included together with the gate dielectric material layer 206 to form a gate dielectric structure. A conductive gate layer 208, such as a workfunction metal layer, is over the gate dielectric material layer 206, and may be directly on the gate dielectric material layer 206 as is depicted. A conductive gate fill material 210 is over the conductive gate layer 208, and may be directly on the conductive gate layer 208 as is depicted. A dielectric gate cap 212 is on the conductive gate fill material 210. A dielectric gate plug 214 is laterally spaced apart from the fin 202 and is on the STI structure 204. The gate dielectric material layer 206 and the conductive gate layer 208 are along sides of the dielectric gate plug 214.

Referring to FIG. 2B, an integrated circuit structure 250 includes a fin 252 having a portion protruding above a shallow trench isolation (STI) structure 254. A gate dielectric material layer 256, such as a high-k gate dielectric layer, is over the protruding portion of the fin 252 and over the STI structure 254. It is to be appreciated that, although not depicted, an oxidized portion of the fin 252 may be between the protruding portion of the fin 252 and the gate dielectric material layer 256 and may be included together with the gate dielectric material layer 256 to form a gate dielectric structure. A conductive gate layer 258, such as a workfunction metal layer, is over the gate dielectric material layer 256, and may be directly on the gate dielectric material layer 256 as is depicted. A conductive gate fill material 260 is over the conductive gate layer 258, and may be directly on the conductive gate layer 258 as is depicted. A dielectric gate cap 262 is on the conductive gate fill material 260.

In an embodiment, a dielectric gate plug 264 is laterally spaced apart from the fin 252 and is on, but is not through, the STI structure 254. As used throughout the disclosure, a dielectric plug referred to as "on but not through" an STI structure can refer to a dielectric plug landed on a top or uppermost surface of the STI, or can refer to a plug extending into but not piercing the STI. In other embodiments, a plug described herein can extend entirely through, or pierce, the STI.

In an embodiment, the gate dielectric material layer 256 and the conductive gate layer 258 are not along sides of the dielectric gate plug 264. Instead, the conductive gate fill material 260 is in contact with the sides of the dielectric gate plug 264. As a result, a region between the dielectric gate plug 264 and the fin 252 includes only one layer of the gate dielectric material layer 256 and only one layer of the conductive gate layer 258, alleviating space constraints in such a tight region of the structure 250. Alleviating space constraints can improve metal fill and/or can facilitate patterning of multiple VTs.

Referring again to FIG. 2B, in an embodiment, the dielectric gate plug 264 is formed after forming the gate dielectric material layer 256, the conductive gate layer 258, and the conductive gate fill material 260. As a result, the gate dielectric material layer 256 and the conductive gate layer 258 are not formed along sides of the dielectric gate plug 264. In an embodiment, the dielectric gate plug 264 has an uppermost surface co-planar with an uppermost surface of the dielectric gate cap 262, as is depicted. In another embodiment, not depicted, a dielectric gate cap 262 is not included, and the dielectric gate plug 264 has an uppermost surface co-planar with an uppermost surface of the conductive gate fill material 260, e.g., along a plane 280.

Figures 3A, 3B:
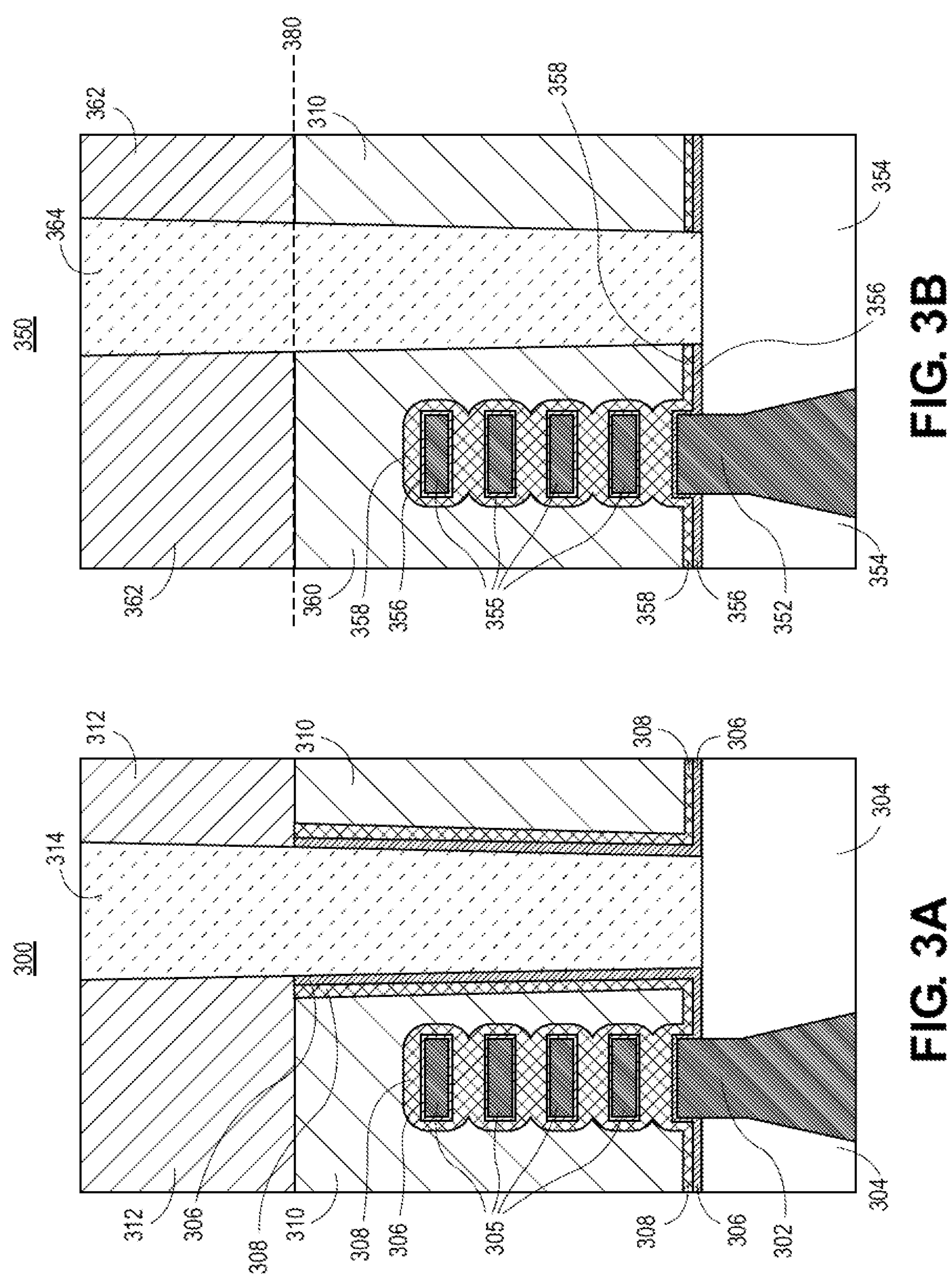
FIG. 3A illustrates a cross-sectional view of an integrated circuit structure having nanowires and a pre-metal gate dielectric plug, in accordance with an embodiment of the present disclosure.
FIG. 3B illustrates a cross-sectional view of an integrated circuit structure having nanowires and a cut metal gate dielectric plug, in accordance with an embodiment of the present disclosure.

A dielectric gate plug can be fabricated for a nanowire device. As a comparative example, FIG. 3A illustrates a cross-sectional view of an integrated circuit structure having nanowires and a pre-metal gate dielectric plug, in accordance with an embodiment of the present disclosure. FIG. 3B illustrates a cross-sectional view of an integrated circuit structure having nanowires and a cut metal gate dielectric plug, in accordance with an embodiment of the present disclosure.

Referring to FIG. 3A, an integrated circuit structure 300 includes a sub-fin 302 having a portion protruding above a shallow trench isolation (STI) structure 304. A plurality of horizontally stacked nanowires 305 is over the sub-fin 302. A gate dielectric material layer 306, such as a high-k gate dielectric layer, is over the protruding portion of the sub-fin 302, over the STI structure 304, and surrounding the horizontally stacked nanowires 305. It is to be appreciated that, although not depicted, an oxidized portion of the sub-fin 302 and horizontally stacked nanowires 305 may be between the protruding portion of the sub-fin 302 and the gate dielectric material layer 306, and between the horizontally stacked nanowires 305 and the gate dielectric material layer 306, and may be included together with the gate dielectric material layer 306 to form a gate dielectric structure. A conductive gate layer 308, such as a workfunction metal layer, is over the gate dielectric material layer 306, and may be directly on the gate dielectric material layer 306 as is depicted. A conductive gate fill material 310 is over the conductive gate layer 308, and may be directly on the conductive gate layer 308 as is depicted. A dielectric gate cap 312 is on the conductive gate fill material 310. A dielectric gate plug 314 is laterally spaced apart from the sub-fin 302 and the plurality of horizontally stacked nanowires 305, and is on the STI structure 304. The gate dielectric material layer 306 and the conductive gate layer 308 are along sides of the dielectric gate plug 314.

Referring to FIG. 3B, an integrated circuit structure 350 includes a sub-fin 352 having a portion protruding above a shallow trench isolation (STI) structure 354. A plurality of horizontally stacked nanowires 355 is over the sub-fin 352. A gate dielectric material layer 356, such as a high-k gate dielectric layer, is over the protruding portion of the sub-fin 352, over the STI structure 354, and surrounding the horizontally stacked nanowires 355. It is to be appreciated that, although not depicted, an oxidized portion of the sub-fin 352 may be between the protruding portion of the sub-fin 352 and the gate dielectric material layer 356, and between the horizontally stacked nanowires 355 and the gate dielectric material layer 356, and may be included together with the gate dielectric material layer 356 to form a gate dielectric structure. A conductive gate layer 358, such as a workfunction metal layer, is over the gate dielectric material layer 356, and may be directly on the gate dielectric material layer 356 as is depicted. A conductive gate fill material 360 is over the conductive gate layer 358, and may be directly on the conductive gate layer 358 as is depicted. A dielectric gate cap 362 is on the conductive gate fill material 360. A dielectric gate plug 364 is laterally spaced apart from the sub-fin 352 and the plurality of horizontally stacked nanowires 355, and is on, but is not through, the STI structure 354. However, the gate dielectric material layer 356 and the conductive gate layer 358 are not along sides of the dielectric gate plug 364. Instead, the conductive gate fill material 360 is in contact with the sides of the dielectric gate plug 364. As a result, a region between the dielectric gate plug 364 and the combination of the sub-fin 352 and the plurality of horizontally stacked nanowires 355 includes only one layer of the gate dielectric material layer 356 and only one layer of the conductive gate layer 358 alleviating space constraints in such a tight region of the structure 350.

Referring again to FIG. 3B, in an embodiment, the dielectric gate plug 364 is formed after forming the gate dielectric material layer 356, the conductive gate layer 358, and the conductive gate fill material 360. As a result, the gate dielectric material layer 356 and the conductive gate layer 358 are not formed along sides of the dielectric gate plug 364. In an embodiment, the dielectric gate plug 364 has an uppermost surface co-planar with an uppermost surface of the dielectric gate cap 362, as is depicted. In another embodiment, not depicted, a dielectric gate cap 362 is not included, and the dielectric gate plug 364 has an uppermost surface co-planar with an uppermost surface of the conductive gate fill material 360, e.g., along a plane 380.

Figures 4A, 4B:
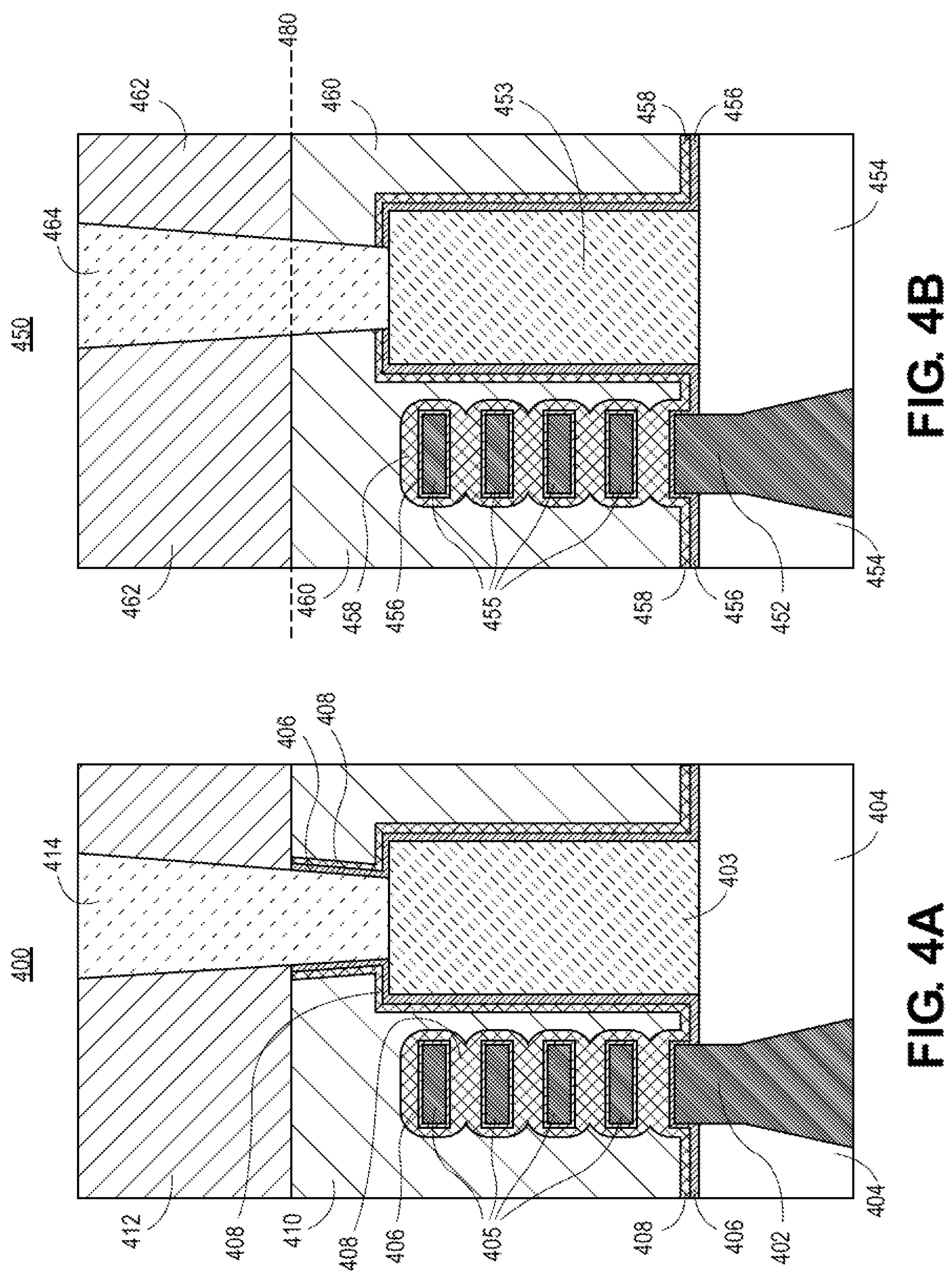
FIG. 4A illustrates a cross-sectional view of an integrated circuit structure having nanowires and a pre-metal gate dielectric plug, in accordance with an embodiment of the present disclosure.
FIG. 4B illustrates a cross-sectional view of an integrated circuit structure having nanowires and a cut metal gate dielectric plug, in accordance with an embodiment of the present disclosure.

A dielectric gate plug can be fabricated on a gate endcap wall for a nanowire device. As a comparative example, FIG. 4A illustrates a cross-sectional view of an integrated circuit structure having nanowires and a pre-metal gate dielectric plug, in accordance with an embodiment of the present disclosure. FIG. 4B illustrates a cross-sectional view of an integrated circuit structure having nanowires and a cut metal gate dielectric plug, in accordance with an embodiment of the present disclosure.

Referring to FIG. 4A, an integrated circuit structure 400 includes a sub-fin 402 having a portion protruding above a shallow trench isolation (STI) structure 404. A plurality of horizontally stacked nanowires 405 is over the sub-fin 402. A gate end cap structure 403, such as a self-aligned gate end cap structure, is on the STI structure 404 and is laterally spaced apart from the sub-fin 402 and the plurality of horizontally stacked nanowires 405. A gate dielectric material layer 406, such as a high-k gate dielectric layer, is over the protruding portion of the sub-fin 402, over the STI structure 404, along sides of the gate end cap structure 403, and surrounding the horizontally stacked nanowires 405. It is to be appreciated that, although not depicted, an oxidized portion of the sub-fin 402 and horizontally stacked nanowires 405 may be between the protruding portion of the sub-fin 402 and the gate dielectric material layer 406, and between the horizontally stacked nanowires 405 and the gate dielectric material layer 406, and may be included together with the gate dielectric material layer 406 to form a gate dielectric structure. A conductive gate layer 408, such as a workfunction metal layer, is over the gate dielectric material layer 406, and may be directly on the gate dielectric material layer 406 as is depicted. A conductive gate fill material 410 is over the conductive gate layer 408, and may be directly on the conductive gate layer 408 as is depicted. A dielectric gate cap 412 is on the conductive gate fill material 410. A dielectric gate plug 414 is on the gate end cap structure 403. The gate dielectric material layer 406 and the conductive gate layer 408 are along sides of the dielectric gate plug 414.

Referring to FIG. 4B, an integrated circuit structure 450 includes a sub-fin 452 having a portion protruding above a shallow trench isolation (STI) structure 454. A plurality of horizontally stacked nanowires 455 is over the sub-fin 452. A gate end cap structure 453, such as a self-aligned gate end cap structure, is on, but is not through, the STI structure 454 and is laterally spaced apart from the sub-fin 452 and the plurality of horizontally stacked nanowires 455. A gate dielectric material layer 456, such as a high-k gate dielectric layer, is over the protruding portion of the sub-fin 452, over the STI structure 454, along sides of the gate end cap structure 453, and surrounding the horizontally stacked nanowires 455. It is to be appreciated that, although not depicted, an oxidized portion of the sub-fin 452 may be between the protruding portion of the sub-fin 452 and the gate dielectric material layer 456, and between the horizontally stacked nanowires 455 and the gate dielectric material layer 456, and may be included together with the gate dielectric material layer 456 to form a gate dielectric structure. A conductive gate layer 458, such as a workfunction metal layer, is over the gate dielectric material layer 456, and may be directly on the gate dielectric material layer 456 as is depicted. A conductive gate fill material 460 is over the conductive gate layer 458, and may be directly on the conductive gate layer 458 as is depicted. A dielectric gate cap 462 is on the conductive gate fill material 460. A dielectric gate plug 464 is on the gate end cap structure 453. However, the gate dielectric material layer 456 and the conductive gate layer 458 are not along sides of the dielectric gate plug 464. Instead, the conductive gate fill material 460 is in contact with the sides of the dielectric gate plug 464.

Referring again to FIG. 4B, in an embodiment, the dielectric gate plug 464 is formed after forming the gate dielectric material layer 456, the conductive gate layer 458, and the conductive gate fill material 460. As a result, the gate dielectric material layer 456 and the conductive gate layer 458 are not formed along sides of the dielectric gate plug 464. In an embodiment, the dielectric gate plug 464 has an uppermost surface co-planar with an uppermost surface of the dielectric gate cap 462, as is depicted. In another embodiment, not depicted, a dielectric gate cap 462 is not included, and the dielectric gate plug 464 has an uppermost surface co-planar with an uppermost surface of the conductive gate fill material 460, e.g., along a plane 480.

Figures 5A, 5B, 5C:
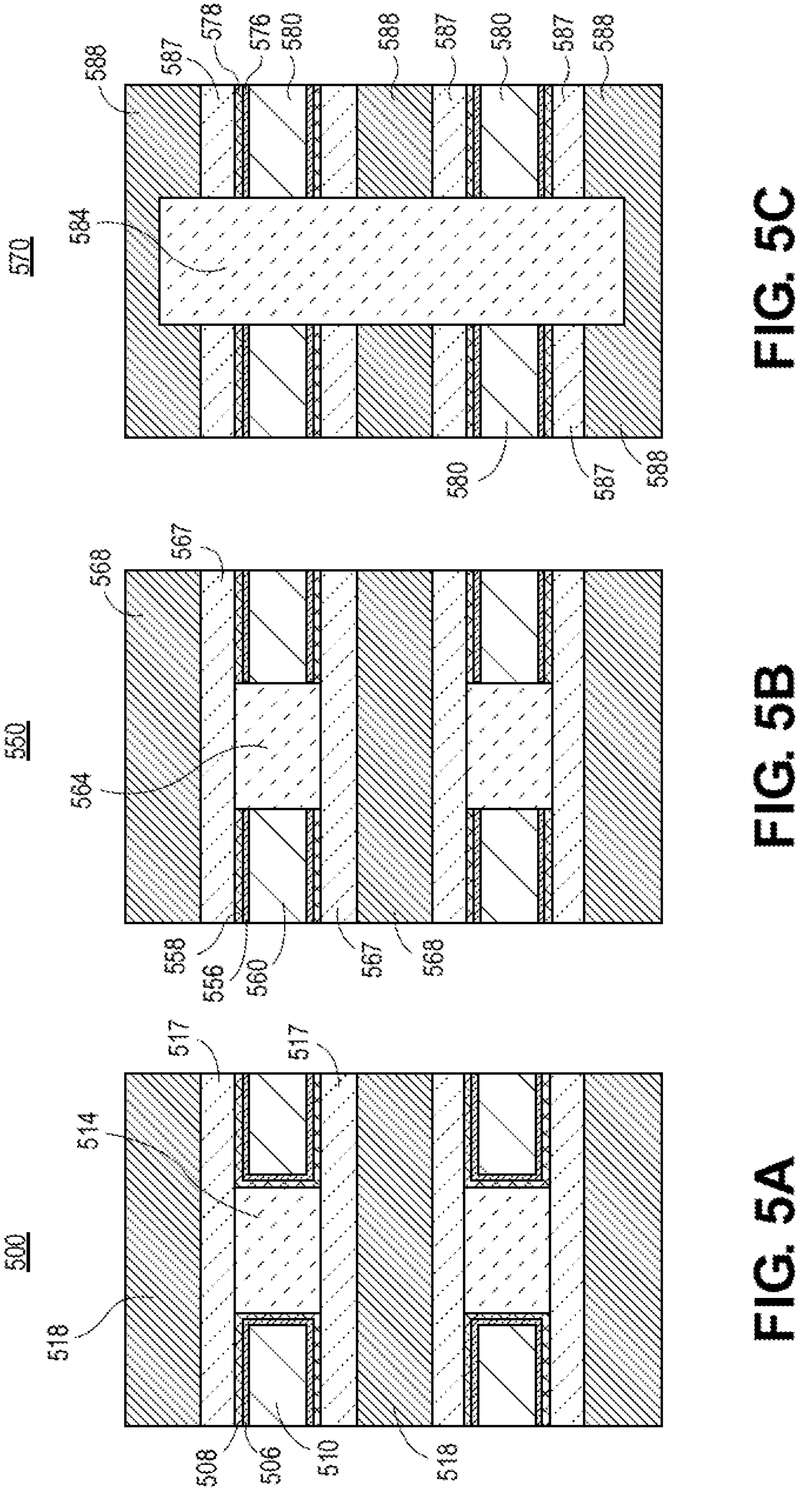
FIGS. 5A-5C illustrate plan views of comparative integrated circuit structures, in accordance with an embodiment of the present disclosure.

In another aspect, selective or non-selective versions of a metal gate cut can be implemented. As an example, FIGS. 5A-5C illustrate plan views of comparative integrated circuit structures, in accordance with an embodiment of the present disclosure. FIG. 5A represents a conventional 'plug-first' approach illustrating two gate plugs in neighboring gates. FIG. 5B represents a selective metal gate cut approach illustrating two gate plugs in neighboring gates. FIG. 5C represents a non-selective metal gate cut approach illustrating one long gate plug across multiple gates.

Referring to FIG. 5A, an integrated circuit structure 500 includes gate lines between dielectric spacers 517 and conductive source or drain contacts 518. Each gate line includes a gate dielectric material layer 506, a conductive gate layer 508, such as a workfunction metal layer, and a conductive gate fill material 510. Dielectric gate plugs 514 can break up portions of a corresponding gate line. The dielectric gate plugs 514 are in contact with the conductive gate layer 508, but not with the gate dielectric material layer 506 or the conductive gate fill material 510. The plan view of FIG. 5A may correspond to the structures of FIG. 2A, 3A, or 4A. It is to be appreciated that, although referred to above as conductive source or drain contacts 518, at earlier stages of the process or in other locations of an integrated circuit structure, a placeholder dielectric or a dielectric plug is in the place of conductive source or drain contacts 518.

Referring to FIG. 5B, an integrated circuit structure 550 includes gate lines between dielectric spacers 567 and conductive source or drain contacts 568. Each gate line includes a gate dielectric material layer 556, a conductive gate layer 558, such as a workfunction metal layer, and a conductive gate fill material 560. Dielectric gate plugs 564 can break up portions of a corresponding gate line. The dielectric gate plugs 564 are in contact with the conductive gate fill material 560. The plan view of FIG. 5B may correspond to the structures of FIG. 2B, 3B, or 4B. It is to be appreciated that, although referred to above as conductive source or drain contacts 568, at earlier stages of the process or in other locations of an integrated circuit structure, a placeholder dielectric or a dielectric plug is in the place of conductive source or drain contacts 568.

Referring to FIG. 5C, an integrated circuit structure 570 includes gate lines between dielectric spacers 587 and conductive source or drain contacts 588. Each gate line includes a gate dielectric material layer 576, a conductive gate layer 578, such as a workfunction metal layer, and a conductive gate fill material 580. A single dielectric gate plug 584 can break up portions of the gate lines, and may extend through dielectric spacers 587, and even partially or fully into one or more of the conductive source or drain contacts 588. The dielectric gate plug 584 is in contact with the conductive gate fill material 580. The plan view of FIG. 5C may correspond to the structures of FIG. 2B, 3B, or 4B.

Referring again to FIG. 5C, it is to be appreciated that, although referred to above as conductive source or drain contacts 588, at earlier stages of the process or in other locations of an integrated circuit structure, a placeholder dielectric or a dielectric plug is in the place of conductive source or drain contacts 588. In an embodiment, an etch used to form an opening in which single dielectric gate plug 584 is ultimately formed is referred to as a non-selective etch. In the case that conductive source or drain contacts 588 are already formed, the non-selective etch can etch into the conductive material of the conductive source or drain contacts 588. In other embodiments, in the case that a placeholder dielectric or a dielectric plug is in the place of conductive source or drain contacts 588 the non-selective etch can etch into the placeholder dielectric or a dielectric plug. In either case, the non-selective etch can etch through, and possibly separate, an epitaxial semiconductor material of source or drain regions formed beneath the location of conductive source or drain contacts 588. In the case that conductive source or drain contacts 588 have already been formed, the epitaxial semiconductor material of the source or drain regions may include silicided portions.

Figures 6A, 6B, 6C:
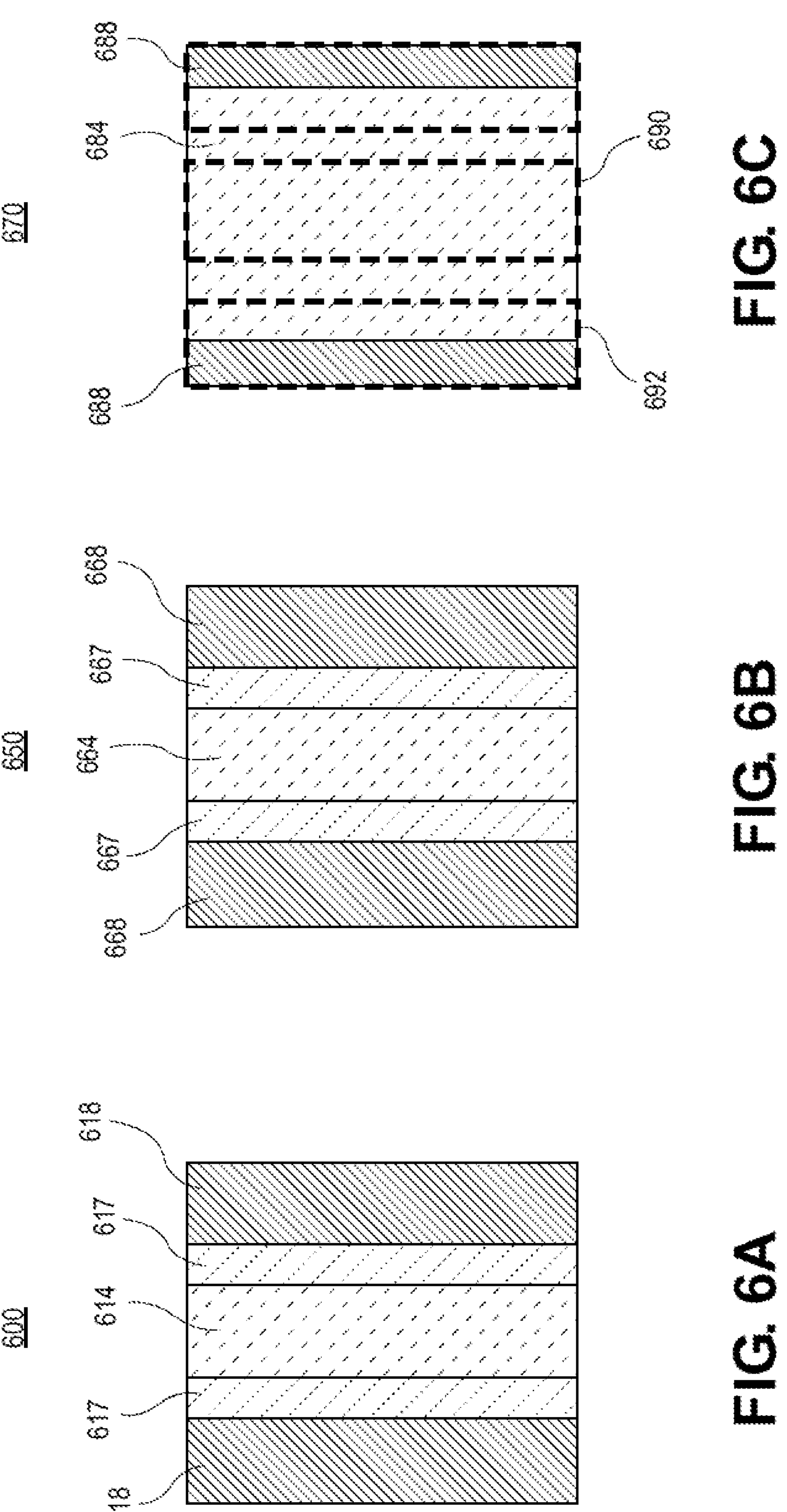
FIGS. 6A-6C illustrate cross-sectional views of comparative integrated circuit structures, in accordance with an embodiment of the present disclosure.

FIGS. 6A-6C illustrate cross-sectional views of comparative integrated circuit structures, in accordance with an embodiment of the present disclosure. FIG. 6A represents a conventional ‘plug-first’ approach. FIG. 6B represents a selective metal gate cut approach. FIG. 6C represents a non-selective metal gate cut approach.

Referring to FIG. 6A, an integrated circuit structure 600 includes a dielectric gate plug 614 between dielectric spacers 617 and conductive source or drain contacts 618. The cross-sectional view of FIG. 6A may be an orthogonal view corresponding to the structures of FIG. 2A, 3A, 4A or 5A.

Referring to FIG. 6B, an integrated circuit structure 650 includes a dielectric gate plug 664 between dielectric spacers 667 and conductive source or drain contacts 668. The cross-sectional view of FIG. 6B may be an orthogonal view corresponding to the structures of FIG. 2B, 3B, 4B or 5B.

Referring to FIG. 6C, an integrated circuit structure 670 includes a single dielectric gate plug 684 between conductive source or drain contacts 688. Dashed box 690 shows where a corresponding discrete gate plug, such as gate plug 664 would be aligned in the case of FIG. 6B. Dashed boxes 692 show where non-recessed source or drain contacts 668 would be aligned in the case of FIG. 6B. The regions between dashed box 690 and dashed boxes 692 show where dielectric spacers 667 would be present in the case of FIG. 6B. The cross-sectional view of FIG. 6C may be an orthogonal view corresponding to the structures of FIG. 2B, 3B, 4B or 5C.

In an embodiment, a metal work function can be: (a) a same metal system in NMOS and PMOS, (b) different metal system between NMOS and PMOS, and/or (c) single material or multi-layer metals (e.g.: W, TiN, TixAlyCz, TaN, Mo, MoN). In an embodiment, a metal cut etch chemistry includes chlorine-containing or fluorine-containing etchants, with possible additional carbon- or silicon-containing components providing passivation.

It is to be appreciated that the embodiments described herein can also include other implementations such as nanowires and/or nanoribbons with various widths, thicknesses and/or materials including but not limited to Si and SiGe. For example, group III-V materials may be used.

It is to be appreciated that, in a particular embodiment, nanowires or nanoribbons, or sacrificial intervening layers, may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may “contaminate” the Si upon diffusion during post deposition processing. As such, embodiments described herein directed to a silicon layer may include a silicon layer that contains a relatively small amount, e.g., “impurity” level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, nanowires or nanoribbons, or sacrificial intervening layers, may be composed of silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may “contaminate” the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

Described below are various devices and processing schemes that may be used to fabricate a device that can be integrated with a cut metal gate. It is to be appreciated that the exemplary embodiments need not necessarily require all features described, or may include more features than are described. For example, nanowire release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front-side and back-side interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a back-side interconnect level.

As an exemplary process flow for fabricating a gate-all-around device of a gate-all-around integrated circuit structure, FIGS. 7A-7J illustrates cross-sectional views of various operations in a method of fabricating a gate-all-around integrated circuit structure, in accordance with an embodiment of the present disclosure.

Figure 7B:
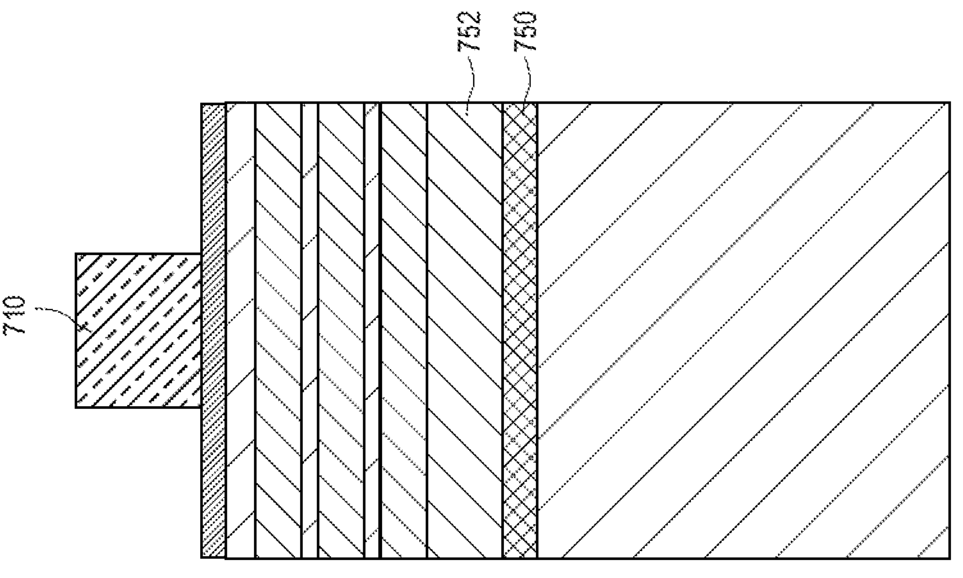
FIGS. 7A-7J illustrates cross-sectional views of various operations in a method of fabricating a gate-all-around integrated circuit structure, in accordance with an embodiment of the present disclosure.
Figure 7A:
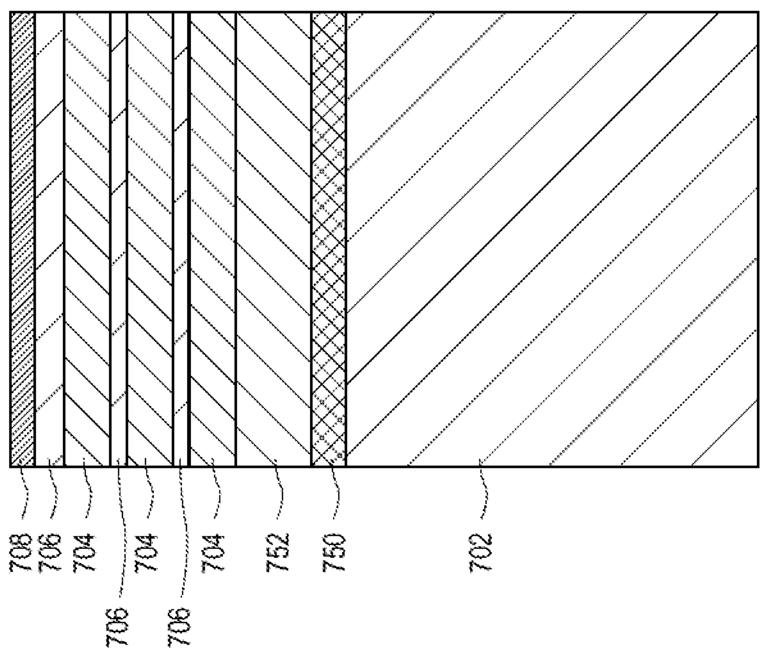

Referring to FIG. 7A, a method of fabricating an integrated circuit structure includes forming a starting stack which includes alternating sacrificial layers 704 and nanowires 706 above a fin 702, such as a silicon fin. The nanowires 706 may be referred to as a vertical arrangement of nanowires. A protective cap 708 may be formed above the alternating sacrificial layers 704 and nanowires 706, as is depicted. A relaxed buffer layer 752 and a defect modification layer 750 may be formed beneath the alternating sacrificial layers 704 and nanowires 706, as is also depicted.

Referring to FIG. 7B, a gate stack 710 is formed over the vertical arrangement of horizontal nanowires 706. Portions of the vertical arrangement of horizontal nanowires 706 are then released by removing portions of the sacrificial layers 704 to provide recessed sacrificial layers 704' and cavities 712, as is depicted in FIG. 7C.

It is to be appreciated that the structure of FIG. 7C may be fabricated to completion without first performing the deep etch and asymmetric contact processing described below. In either case (e.g., with or without asymmetric contact processing), in an embodiment, a fabrication process involves use of a process scheme that provides a gate-all-around integrated circuit structure having epitaxial nubs, which may be vertically discrete source or drain structures.

Figure 7D:
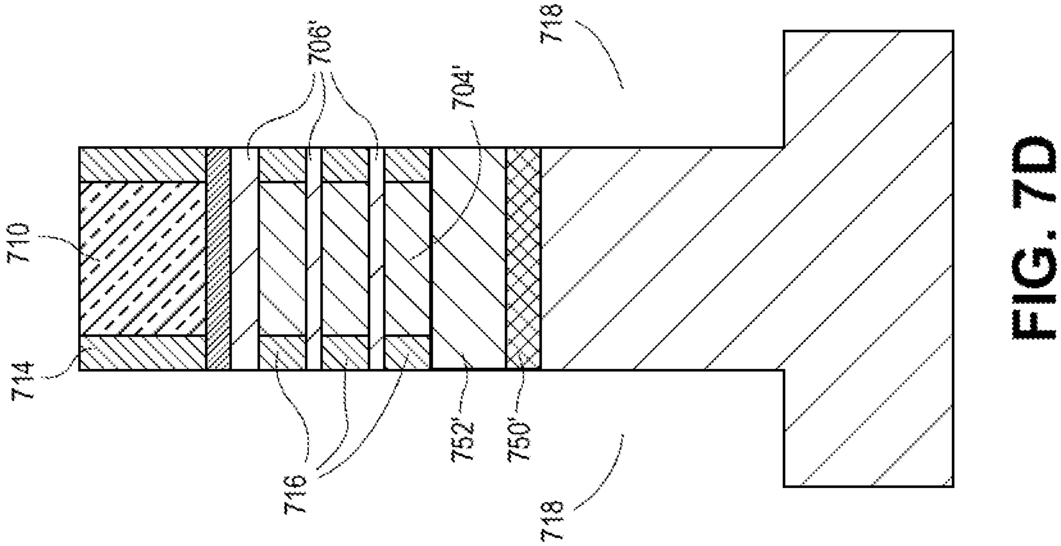
Figure 7C:
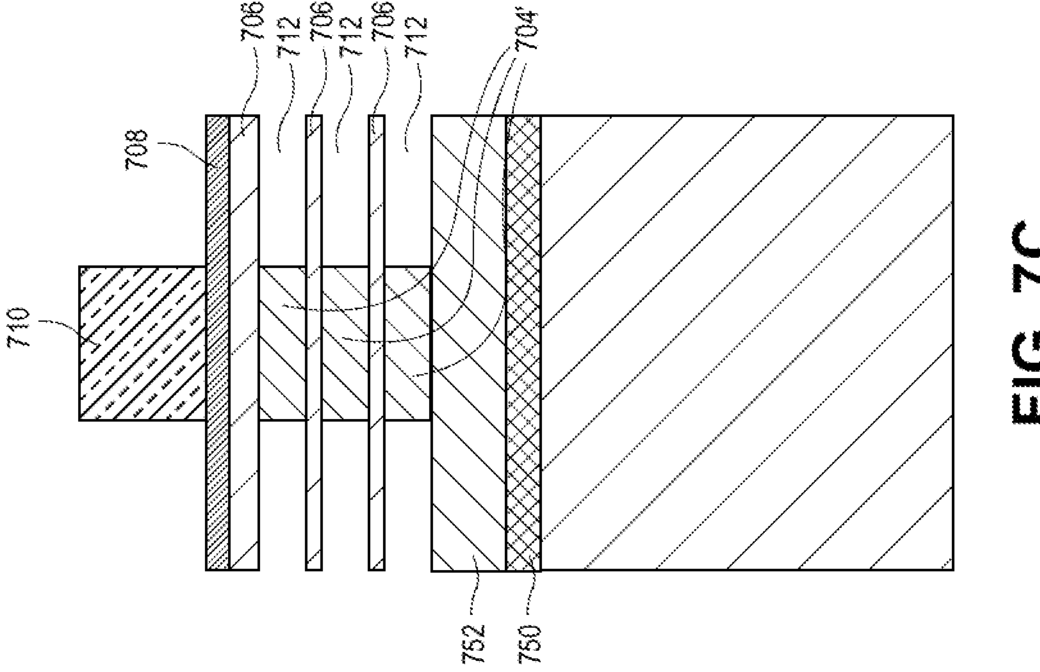

Referring to FIG. 7D, upper gate spacers 714 are formed at sidewalls of the gate structure 710. Cavity spacers 716 are formed in the cavities 712 beneath the upper gate spacers 714. A deep trench contact etch is then optionally performed to form trenches 718 and to form recessed nanowires 706'. A patterned relaxed buffer layer 752' and a patterned defect modification layer 750' may also be present, as is depicted.

Figures 7E, 7F, 7G:
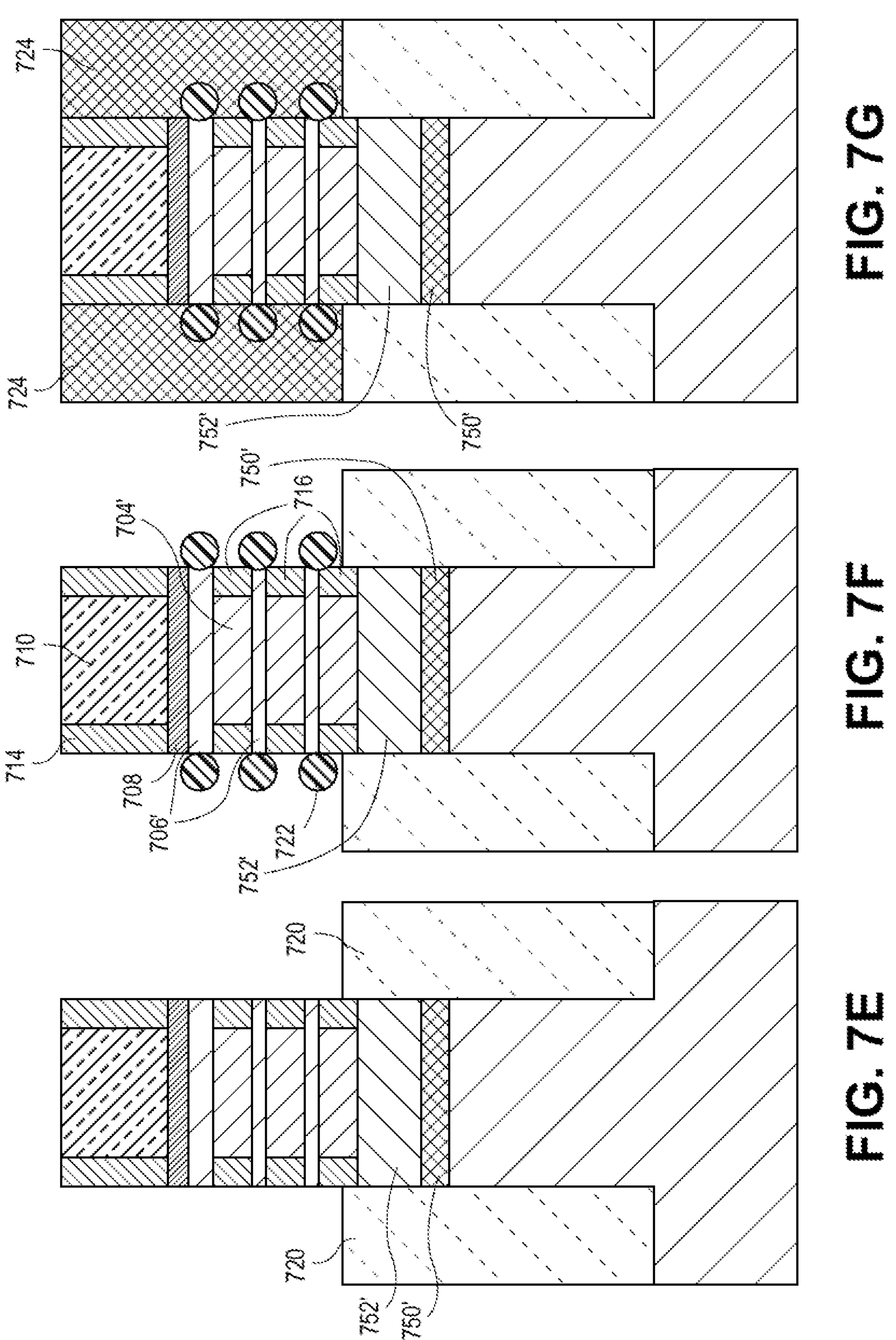

A sacrificial material 720 is then formed in the trenches 718, as is depicted in FIG. 7E. In other process schemes, an isolated trench bottom or silicon trench bottom may be used.

Referring to FIG. 7F, a first epitaxial source or drain structure (e.g., left-hand features 722) is formed at a first end of the vertical arrangement of horizontal nanowires 706'. A second epitaxial source or drain structure (e.g., right-hand features 722) is formed at a second end of the vertical arrangement of horizontal nanowires 706'. In an embodiment, as depicted, the epitaxial source or drain structures 722 are vertically discrete source or drain structures and may be referred to as epitaxial nubs.

Figures 7H, 7I, 7J:
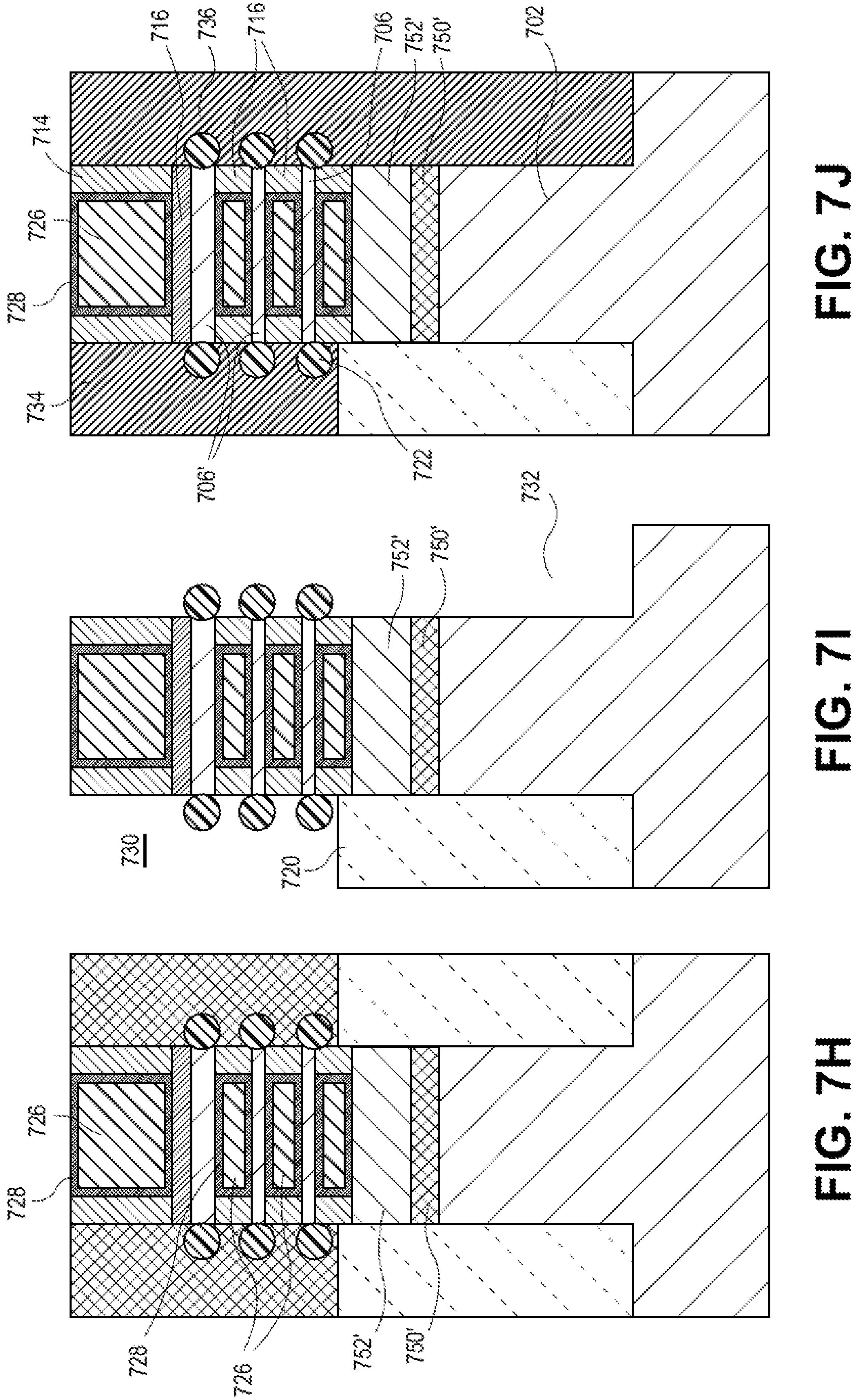

An inter-layer dielectric (ILD) material 724 is then formed at the sides of the gate electrode 710 and adjacent the source or drain structures 722, as is depicted in FIG. 7G. Referring to FIG. 7H, a replacement gate process is used to form a permanent gate dielectric 728 and a permanent gate electrode 726. The ILD material 724 is then removed, as is depicted in FIG. 7I. The sacrificial material 720 is then removed from one of the source drain locations (e.g., right-hand side) to form trench 732, but is not removed from the other of the source drain locations to form trench 730.

Referring to FIG. 7J, a first conductive contact structure 734 is formed coupled to the first epitaxial source or drain structure (e.g., left-hand features 722). A second conductive contact structure 736 is formed coupled to the second epitaxial source or drain structure (e.g., right-hand features 722). The second conductive contact structure 736 is formed deeper along the fin 702 than the first conductive contact structure 734. In an embodiment, although not depicted in FIG. 7J, the method further includes forming an exposed surface of the second conductive contact structure 736 at a bottom of the fin 702. Conductive contacts may include a contact resistance reducing layer and a primary contact electrode layer, where examples can include Ti, Ni, Co (for the former and W, Ru, Co for the latter.)

In an embodiment, the second conductive contact structure 736 is deeper along the fin 702 than the first conductive contact structure 734, as is depicted. In one such embodiment, the first conductive contact structure 734 is not along the fin 702, as is depicted. In another such embodiment, not depicted, the first conductive contact structure 734 is partially along the fin 702.

In an embodiment, the second conductive contact structure 736 is along an entirety of the fin 702. In an embodiment, although not depicted, in the case that the bottom of the fin 702 is exposed by a back-side substrate removal process, the second conductive contact structure 736 has an exposed surface at a bottom of the fin 702.

In an embodiment, the structure of FIG. 7J, or related structures of FIGS. 7A-7J, can be formed using an offset gate cut approach, such as described above.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performance. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CHIP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 8 illustrates a cross-sectional view of a non-planar integrated circuit structure as taken along a gate line, in accordance with an embodiment of the present disclosure.

Figure 8:
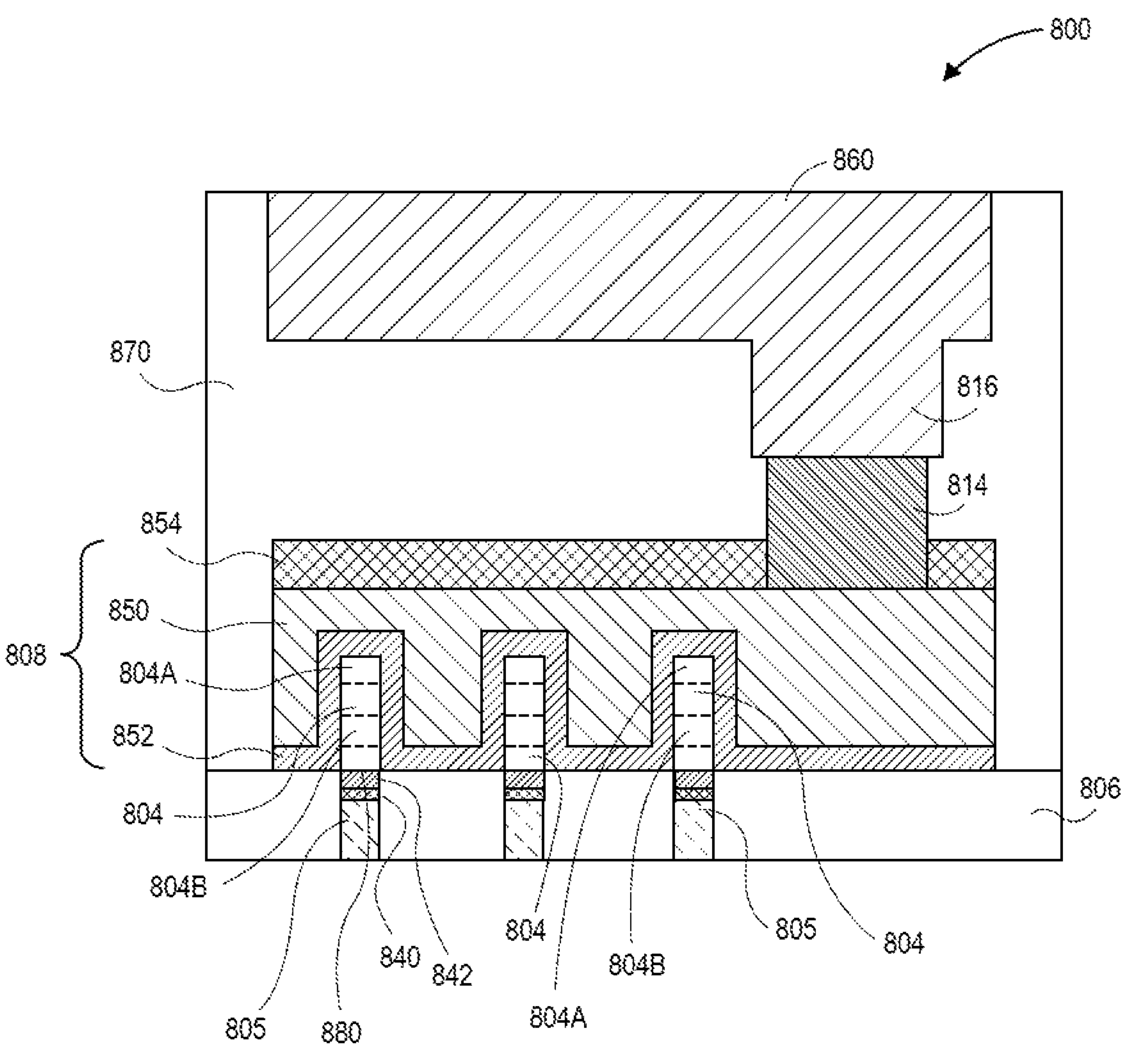
FIG. 8 illustrates a cross-sectional view of a non-planar integrated circuit structure as taken along a gate line, in accordance with an embodiment of the present disclosure.

Referring to FIG. 8, a semiconductor structure or device 800 includes a non-planar active region (e.g., a fin structure including protruding fin portion 804 and sub-fin region 805) within a trench isolation region 806. In an embodiment, instead of a solid fin, the non-planar active region is separated into nanowires (such as nanowires 804A and 804B) above sub-fin region 805, as is represented by the dashed lines. In either case, for ease of description for non-planar integrated circuit structure 800, a non-planar active region 804 is referenced below as a protruding fin portion. In an embodiment, the sub-fin region 805 also includes a relaxed buffer layer 842 and a defect modification layer 840, as is depicted.

A gate line 808 is disposed over the protruding portions 804 of the non-planar active region (including, if applicable, surrounding nanowires 804A and 804B), as well as over a portion of the trench isolation region 806. As shown, gate line 808 includes a gate electrode 850 and a gate dielectric layer 852. In one embodiment, gate line 808 may also include a dielectric cap layer 854. A gate contact 814, and overlying gate contact via 816 are also seen from this perspective, along with an overlying metal interconnect 860, all of which are disposed in inter-layer dielectric stacks or layers 870. Also seen from the perspective of FIG. 8, the gate contact 814 is, in one embodiment, disposed over trench isolation region 806, but not over the non-planar active regions. In another embodiment, the gate contact 814 is over the non-planar active regions.

In an embodiment, the semiconductor structure or device 800 is a non-planar device such as, but not limited to, a fin-FET device, a tri-gate device, a nanoribbon device, or a nanowire device. In such an embodiment, a corresponding semiconducting channel region is composed of or is formed in a three-dimensional body. In one such embodiment, the gate electrode stacks of gate lines 808 surround at least a top surface and a pair of sidewalls of the three-dimensional body.

As is also depicted in FIG. 8, in an embodiment, an interface 880 exists between a protruding fin portion 804 and sub-fin region 805. The interface 880 can be a transition region between a doped sub-fin region 805 and a lightly or undoped upper fin portion 804. In one such embodiment, each fin is approximately 10 nanometers wide or less, and sub-fin dopants are optionally supplied from an adjacent solid state doping layer at the sub-fin location. In a particular such embodiment, each fin is less than 10 nanometers wide.

Although not depicted in FIG. 8, it is to be appreciated that source or drain regions of or adjacent to the protruding fin portions 804 are on either side of the gate line 808, i.e., into and out of the page. In one embodiment, the material of the protruding fin portions 804 in the source or drain locations is removed and replaced with another semiconductor material, e.g., by epitaxial deposition to form epitaxial source or drain structures. The source or drain regions may extend below the height of dielectric layer of trench isolation region 806, i.e., into the sub-fin region 805. In accordance with an embodiment of the present disclosure, the more heavily doped sub-fin regions, i.e., the doped portions of the fins below interface 880, inhibits source to drain leakage through this portion of the bulk semiconductor fins. In an embodiment, the source and drain regions have associated asymmetric source and drain contact structures, as described above in association with FIG. 7J.

With reference again to FIG. 8, in an embodiment, fins 804/805 (and, possibly nanowires 804A and 804B) are composed of a crystalline silicon germanium layer which may be doped with a charge carrier, such as but not limited to phosphorus, arsenic, boron, gallium or a combination thereof.

In an embodiment, trench isolation region 806, and trench isolation regions (trench isolations structures or trench isolation layers) described throughout, may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, trench isolation region 806 is composed of a dielectric material such as, but not limited to, silicon dioxide, silicon oxy-nitride, silicon nitride, or carbon-doped silicon nitride.

Gate line 808 may be composed of a gate electrode stack which includes a gate dielectric layer 852 and a gate electrode layer 850. In an embodiment, the gate electrode of the gate electrode stack is composed of a metal gate and the gate dielectric layer is composed of a high-k material. For example, in one embodiment, the gate dielectric layer 852 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 852 may include a layer of native oxide formed from the top few layers of the substrate fin 804. In an embodiment, the gate dielectric layer 852 is composed of a top high-k portion and a lower portion composed of an oxide of a semiconductor material. In one embodiment, the gate dielectric layer 852 is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer 850 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer 850 is composed of a non-workfunction-setting fill material formed above a metal workfunction-setting layer.

The gate electrode layer 850 may consist of a P-type workfunction metal or an N-type workfunction metal, depending on whether the transistor is to be a PMOS or an NMOS transistor. In some implementations, the gate electrode layer 850 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, tungsten and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 814 and overlying gate contact via 816 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 808 is formed while eliminating the use of a lithographic step with exceedingly tight registration budget. In an embodiment, the contact pattern is a vertically symmetric contact pattern, or an asymmetric contact pattern such as described in association with FIG. 7J. In other embodiments, all contacts are front-side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 800 involves fabrication of the gate stack structure 808 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 8, the arrangement of semiconductor structure or device 800 places the gate contact over isolation regions. Such an arrangement may be viewed as inefficient use of layout space. In another embodiment, however, a semiconductor device has contact structures that contact portions of a gate electrode formed over an active region, e.g., over a fin 805, and in a same layer as a trench contact via.

In an embodiment, the structure of FIG. 8 can be formed using an offset gate cut approach, such as described above.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed).

To provide further context, advantages of a self-aligned gate endcap (SAGE) architecture may include the enabling of higher layout density and, in particular, scaling of diffusion to diffusion spacing. To provide illustrative comparison, FIG. 9 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Figure 9:
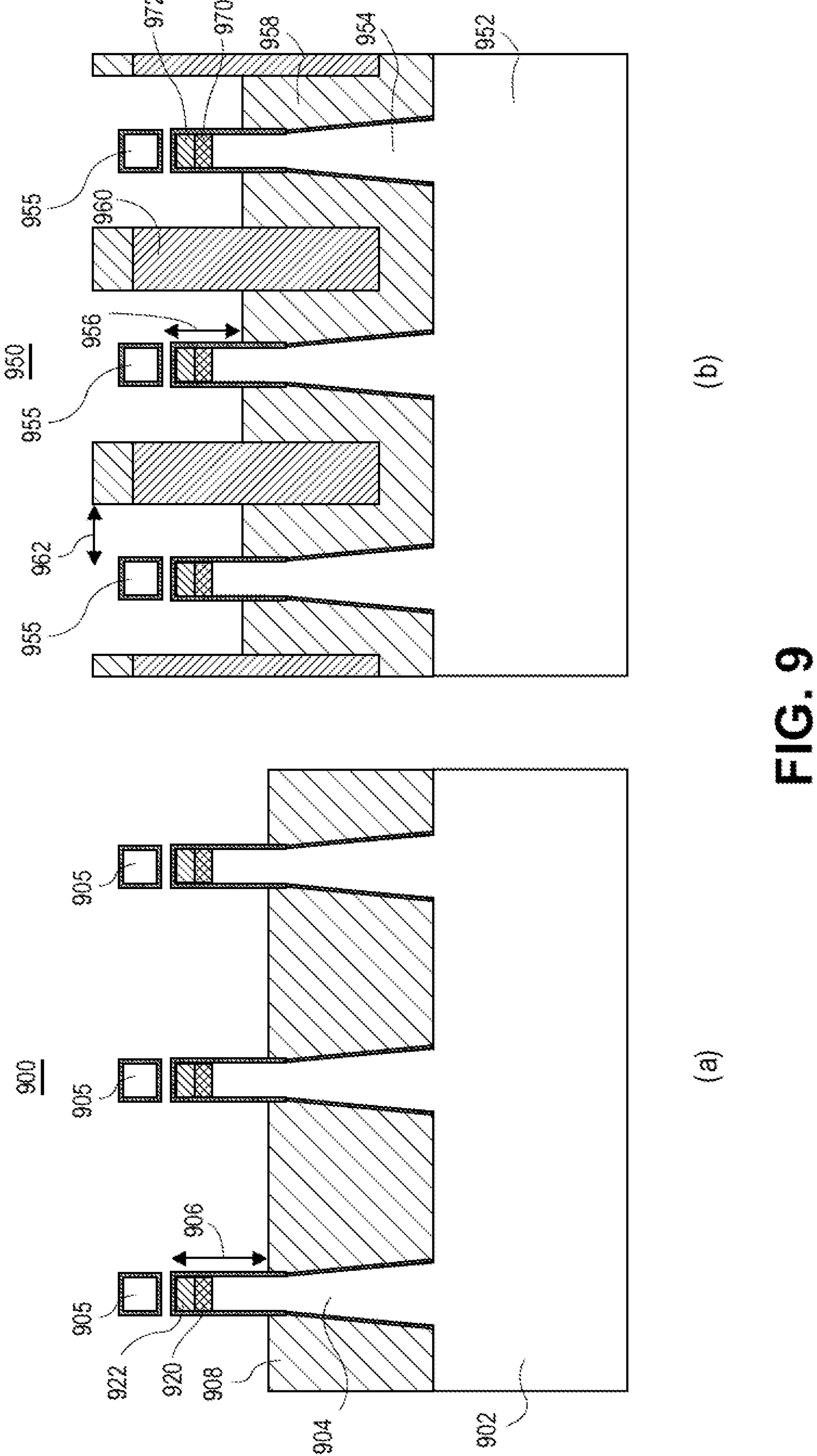
FIG. 9 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 9, an integrated circuit structure 900 includes a substrate 902 having fins 904 protruding there from by an amount 906 above an isolation structure 908 laterally surrounding lower portions of the fins 904. Upper portions of the fins may include a relaxed buffer layer 922 and a defect modification layer 920, as is depicted. Corresponding nanowires 905 are over the fins 904. A gate structure may be formed over the integrated circuit structure 900 to fabricate a device. However, breaks in such a gate structure may be accommodated for by increasing the spacing between fin 904/nanowire 905 pairs.

By contrast, referring to the right-hand side (b) of FIG. 9, an integrated circuit structure 950 includes a substrate 952 having fins 954 protruding therefrom by an amount 956 above an isolation structure 958 laterally surrounding lower portions of the fins 954. Upper portions of the fins may include a relaxed buffer layer 972 and a defect modification layer 970, as is depicted. Corresponding nanowires 955 are over the fins 954. Isolating SAGE walls 960 (which may include a hardmask thereon, as depicted) are included within the isolation structure 952 and between adjacent fin 954/nanowire 955 pairs. The distance between an isolating SAGE wall 960 and a nearest fin 954/nanowire 955 pair defines the gate endcap spacing 962. A gate structure may be formed over the integrated circuit structure 900, between insolating SAGE walls to fabricate a device. Breaks in such a gate structure are imposed by the isolating SAGE walls. Since the isolating SAGE walls 960 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 960. In an embodiment, as depicted, the SAGE walls 960 each include a lower dielectric portion and a dielectric cap on the lower dielectric portion. In accordance with an embodiment of the present disclosure, a fabrication process for structures associated with FIG. 9 involves use of a process scheme that provides a gate-all-around integrated circuit structure having epitaxial source or drain structures.

In an embodiment, the structure of part (a) of FIG. 9 can be formed using an offset gate cut approach, such as described above. In an embodiment, the structure of part (b) of FIG. 9 can be formed using an offset gate cut approach, such as described above.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 10:
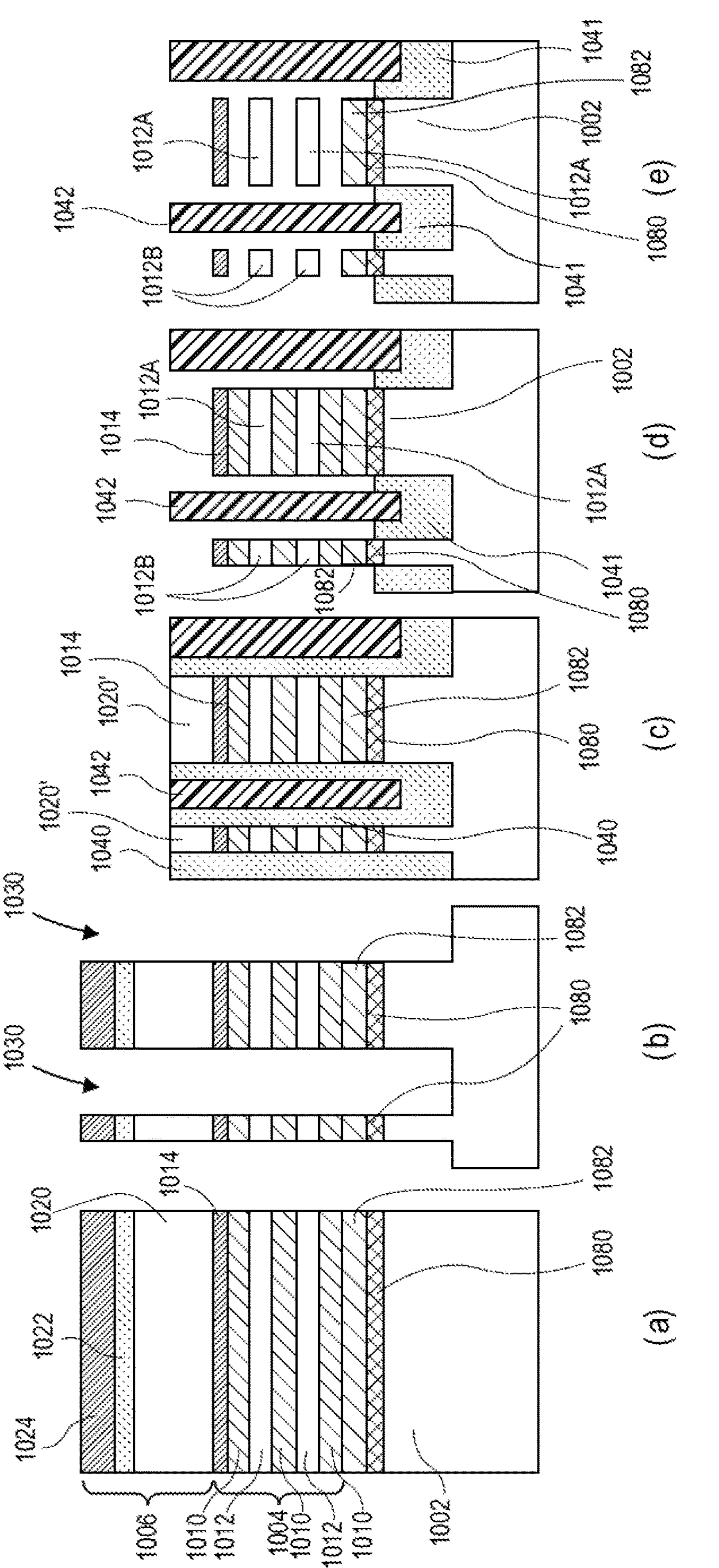
FIG. 10 illustrates cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 10 illustrate cross-sectional views representing various operations in a method of fabricating a self-aligned gate endcap (SAGE) structure with gate-all-around devices, in accordance with an embodiment of the present disclosure.

Referring to part (a) of FIG. 10, a starting structure includes a nanowire patterning stack 1004 above a substrate 1002. A lithographic patterning stack 1006 is formed above the nanowire patterning stack 1004. The nanowire patterning stack 1004 includes alternating sacrificial layers 1010 and nanowire layers 1012, which may be above a relaxed buffer layer 1082 and a defect modification layer 1080, as is depicted. A protective mask 1014 is between the nanowire patterning stack 1004 and the lithographic patterning stack

1006. In one embodiment, the lithographic patterning stack 1006 is trilayer mask composed of a topographic masking portion 1020, an anti-reflective coating (ARC) layer 1022, and a photoresist layer 1024. In a particular such embodiment, the topographic masking portion 1020 is a carbon hardmask (CHM) layer and the anti-reflective coating layer 1022 is a silicon ARC layer.

Referring to part (b) of FIG. 10, the stack of part (a) is lithographically patterned and then etched to provide an etched structure including a patterned substrate 1002 and trenches 1030.

Referring to part (c) of FIG. 10, the structure of part (b) has an isolation layer 1040 and a SAGE material 1042 formed in trenches 1030. The structure is then planarized to leave patterned topographic masking layer 1020' as an exposed upper layer.

Referring to part (d) of FIG. 10, the isolation layer 1040 is recessed below an upper surface of the patterned substrate 1002, e.g., to define a protruding fin portion and to provide a trench isolation structure 1041 beneath SAGE walls 1042.

Referring to part (e) of FIG. 10, the sacrificial layers 1010 are removed at least in the channel region to release nanowires 1012A and 1012B. Subsequent to the formation of the structure of part (e) of FIG. 10, a gate stacks may be formed around nanowires 1012B or 1012A, over protruding fins of substrate 1002, and between SAGE walls 1042. In one embodiment, prior to formation of the gate stacks, the remaining portion of protective mask 1014 is removed. In another embodiment, the remaining portion of protective mask 1014 is retained as an insulating fin hat as an artifact of the processing scheme.

Referring again to part (e) of FIG. 10, it is to be appreciated that a channel view is depicted, with source or drain regions being locating into and out of the page. In an embodiment, the channel region including nanowires 1012B has a width less than the channel region including nanowires 1012A. Thus, in an embodiment, an integrated circuit structure includes multiple width (multi-Wsi) nanowires. Although structures of 1012B and 1012A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 10). In accordance with an embodiment of the present disclosure, a fabrication process for structures associated with FIG. 10 involves use of a process scheme that provides a gate-all-around integrated circuit structure having epitaxial source or drain structures.

In an embodiment, the structure of part (e) FIG. 10 can be formed using an offset gate cut approach, such as described above.

In an embodiment, as described throughout, self-aligned gate endcap (SAGE) isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Figures 11A, 11B, 11C:
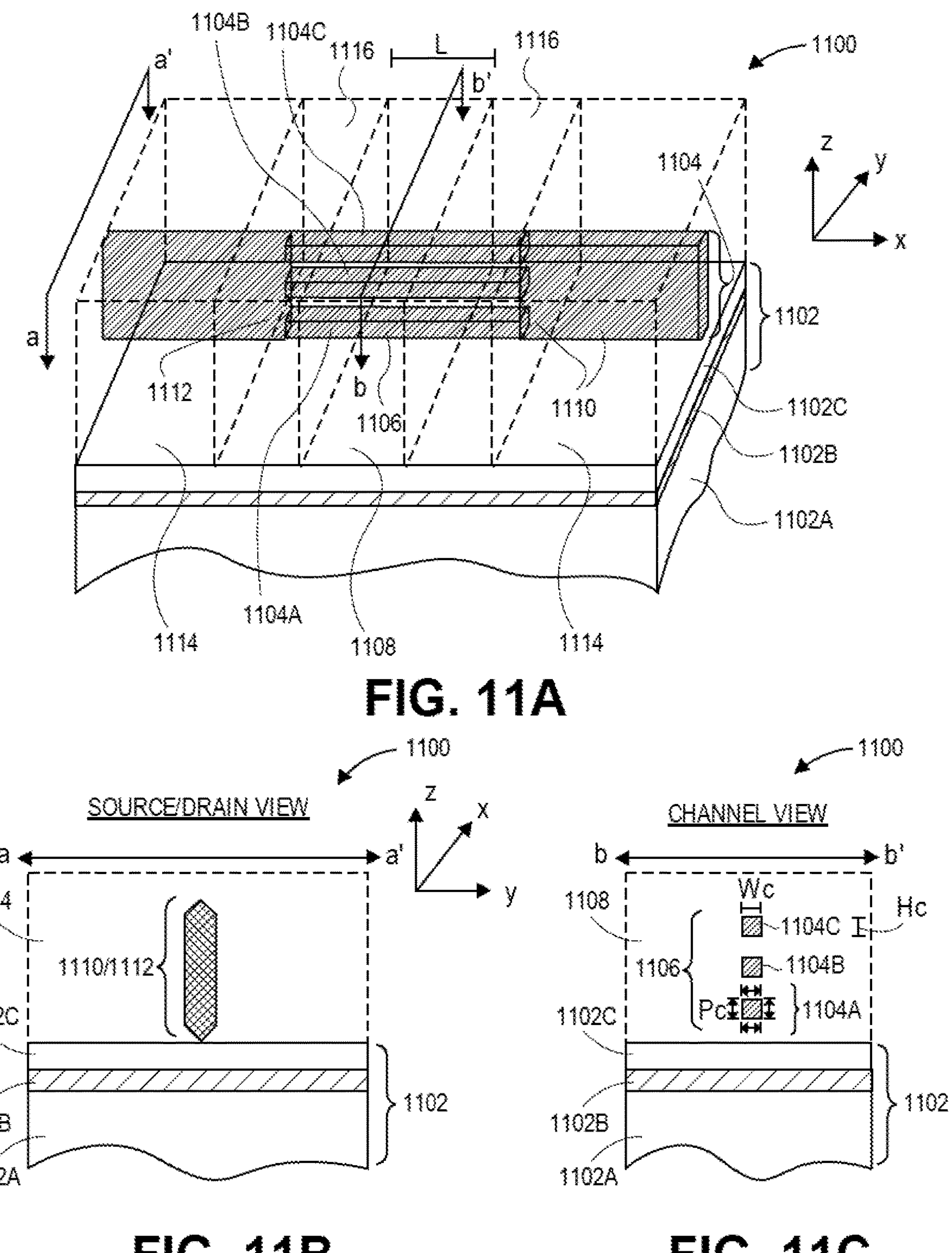
FIG. 11A illustrates a three-dimensional cross-sectional view of a nanowire-based integrated circuit structure, in accordance with an embodiment of the present disclosure.
FIG. 11B illustrates a cross-sectional source or drain view of the nanowire-based integrated circuit structure of FIG. 11A, as taken along the a-a' axis, in accordance with an embodiment of the present disclosure.
FIG. 11C illustrates a cross-sectional channel view of the nanowire-based integrated circuit structure of FIG. 11A, as taken along the b-b' axis, in accordance with an embodiment of the present disclosure.

To highlight an exemplary integrated circuit structure having three vertically arranged nanowires, FIG. 11A illustrates a three-dimensional cross-sectional view of a nanowire-based integrated circuit structure, in accordance with an embodiment of the present disclosure. FIG. 11B illustrates a cross-sectional source or drain view of the nanowire-based integrated circuit structure of FIG. 11A, as taken along the a-a' axis. FIG. 11C illustrates a cross-sectional channel view of the nanowire-based integrated circuit structure of FIG. 11A, as taken along the b-b' axis.

Referring to FIG. 11A, an integrated circuit structure 1100 includes one or more vertically stacked nanowires (1104 set) above a substrate 1102. In an embodiment, as depicted, a relaxed buffer layer 1102C, a defect modification layer 1102B, and a lower substrate portion 1102A are included in substrate 1102, as is depicted. An optional fin below the bottommost nanowire and formed from the substrate 1102 is not depicted for the sake of emphasizing the nanowire portion for illustrative purposes. Embodiments herein are targeted at both single wire devices and multiple wire devices. As an example, a three nanowire-based devices having nanowires 1104A, 1104B and 1104C is shown for illustrative purposes. For convenience of description, nanowire 1104A is used as an example where description is focused on one of the nanowires. It is to be appreciated that where attributes of one nanowire are described, embodiments based on a plurality of nanowires may have the same or essentially the same attributes for each of the nanowires.

Each of the nanowires 1104 includes a channel region 1106 in the nanowire. The channel region 1106 has a length (L). Referring to FIG. 11C, the channel region also has a perimeter (Pc) orthogonal to the length (L). Referring to both FIGS. 11A and 11C, a gate electrode stack 1108 surrounds the entire perimeter (Pc) of each of the channel regions 1106. The gate electrode stack 1108 includes a gate electrode along with a gate dielectric layer between the channel region 1106 and the gate electrode (not shown). In an embodiment, the channel region is discrete in that it is completely surrounded by the gate electrode stack 1108 without any intervening material such as underlying substrate material or overlying channel fabrication materials. Accordingly, in embodiments having a plurality of nanowires 1104, the channel regions 1106 of the nanowires are also discrete relative to one another.

Referring to both FIGS. 11A and 11B, integrated circuit structure 1100 includes a pair of non-discrete source or drain regions 1110/1112. The pair of non-discrete source or drain regions 1110/1112 is on either side of the channel regions 1106 of the plurality of vertically stacked nanowires 1104. Furthermore, the pair of non-discrete source or drain regions 1110/1112 is adjoining for the channel regions 1106 of the plurality of vertically stacked nanowires 1104. In one such embodiment, not depicted, the pair of non-discrete source or drain regions 1110/1112 is directly vertically adjoining for the channel regions 1106 in that epitaxial growth is on and between nanowire portions extending beyond the channel regions 1106, where nanowire ends are shown within the source or drain structures. In another embodiment, as depicted in FIG. 11A, the pair of non-discrete source or drain regions 1110/1112 is indirectly vertically adjoining for the channel regions 1106 in that they are formed at the ends of the nanowires and not between the nanowires.

In an embodiment, as depicted, the source or drain regions 1110/1112 are non-discrete in that there are not individual and discrete source or drain regions for each channel region 1106 of a nanowire 1104. Accordingly, in embodiments having a plurality of nanowires 1104, the source or drain regions 1110/1112 of the nanowires are global or unified source or drain regions as opposed to discrete for each nanowire. That is, the non-discrete source or drain regions 1110/1112 are global in the sense that a single unified feature is used as a source or drain region for a plurality (in this case, 3) of nanowires 1104 and, more particularly, for more than one discrete channel region 1106. In one embodiment, from a cross-sectional perspective orthogonal to the length of the discrete channel regions 1106, each of the pair of non-discrete source or drain regions 1110/1112 is approximately rectangular in shape with a bottom tapered portion and a top vertex portion, as depicted in FIG. 11B. In other embodiments, however, the source or drain regions 1110/1112 of the nanowires are relatively larger yet discrete non-vertically merged epitaxial structures such as nubs described in association with FIGS. 7A-7J.

In accordance with an embodiment of the present disclosure, and as depicted in FIGS. 11A and 11B, integrated circuit structure 1100 further includes a pair of contacts 1114, each contact 1114 on one of the pair of non-discrete source or drain regions 1110/1112. In one such embodiment, in a vertical sense, each contact 1114 completely surrounds the respective non-discrete source or drain region 1110/1112. In another aspect, the entire perimeter of the non-discrete source or drain regions 1110/1112 may not be accessible for contact with contacts 1114, and the contact 1114 thus only partially surrounds the non-discrete source or drain regions 1110/1112, as depicted in FIG. 11B. In a contrasting embodiment, not depicted, the entire perimeter of the non-discrete source or drain regions 1110/1112, as taken along the a-a' axis, is surrounded by the contacts 1114.

Referring again to FIG. 11A, in an embodiment, integrated circuit structure 1100 further includes a pair of spacers 1116. As is depicted, outer portions of the pair of spacers 1116 may overlap portions of the non-discrete source or drain regions 1110/1112, providing for "embedded" portions of the non-discrete source or drain regions 1110/1112 beneath the pair of spacers 1116. As is also depicted, the embedded portions of the non-discrete source or drain regions 1110/1112 may not extend beneath the entirety of the pair of spacers 1116.

Substrate 1102 may be composed of a material suitable for integrated circuit structure fabrication. In one embodiment, substrate 1102 includes a lower bulk substrate composed of a single crystal of a material which may include, but is not limited to, silicon, germanium, silicon-germanium, germanium-tin, silicon-germanium-tin, or a group III-V compound semiconductor material. An upper insulator layer composed of a material which may include, but is not limited to, silicon dioxide, silicon nitride or silicon oxy-nitride is on the lower bulk substrate. Thus, the structure 1100 may be fabricated from a starting semiconductor-on-insulator substrate. Alternatively, the structure 1100 is formed directly from a bulk substrate and local oxidation is used to form electrically insulative portions in place of the above described upper insulator layer. In another alternative embodiment, the structure 1100 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 1104 may be sized as wires or ribbons, as described below, and may have squared-off or rounder corners. In an embodiment, the nanowires 1104 are composed of a material such as, but not limited to, silicon, germanium, or a combination thereof. In one such embodiment, the nanowires are single-crystalline. For example, for a silicon nanowire 1104, a single-crystalline nanowire may be based from a (100) global orientation, e.g., with a <100> plane in the z-direction. As described below, other orientations may also be considered. In an embodiment, the dimensions of the nanowires 1104, from a cross-sectional perspective, are on the nano-scale. For example, in a specific embodiment, the smallest dimension of the nanowires 1104 is less than approximately 20 nanometers. In an embodiment, the nanowires 1104 are composed of a strained material, particularly in the channel regions 1106.

Referring to FIGS. 11C, in an embodiment, each of the channel regions 1106 has a width (Wc) and a height (Hc), the width (Wc) approximately the same as the height (Hc). That is, in both cases, the channel regions 1106 are square-like or, if corner-rounded, circle-like in cross-section profile. In another aspect, the width and height of the channel region need not be the same, such as the case for nanoribbons as described throughout.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, the structure of FIGS. 11A-11C can be formed using an offset gate cut approach, such as described above.

In an embodiment, as described throughout, an underlying substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron, gallium or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 12:
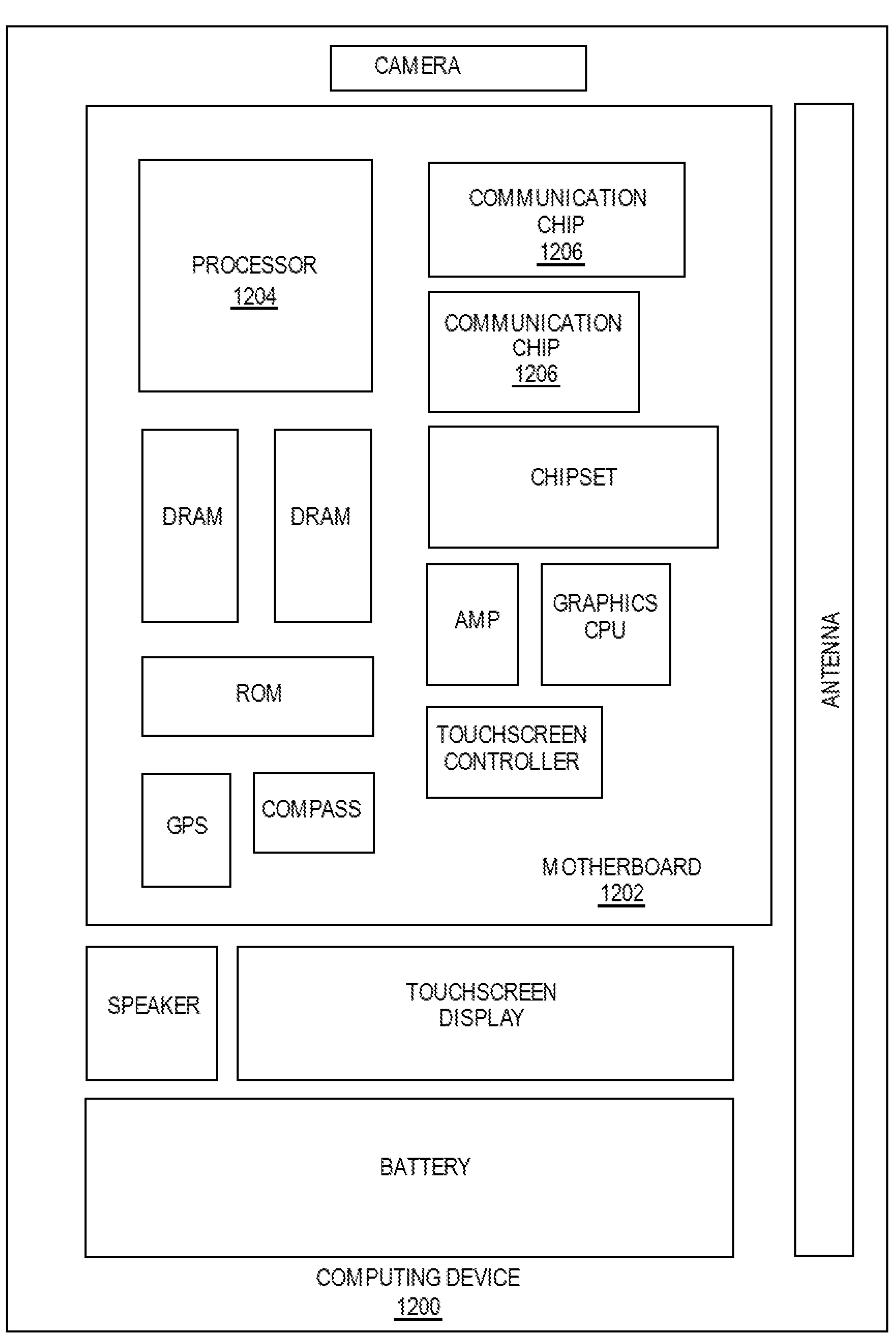
FIG. 12 illustrates a computing device in accordance with one implementation of an embodiment of the disclosure.

FIG. 12 illustrates a computing device 1200 in accordance with one implementation of an embodiment of the present disclosure. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. The integrated circuit die of the processor 1204 may include one or more structures, such as gate-all-around integrated circuit structures having gate cut plugs removed from trench contacts, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. The integrated circuit die of the communication chip 1206 may include one or more structures, such as gate-all-around integrated circuit structures having gate cut plugs removed from trench contacts, built in accordance with implementations of embodiments of the present disclosure.

In further implementations, another component housed within the computing device 1200 may contain an integrated circuit die that includes one or structures, such as gate-all-around integrated circuit structures having gate cut plugs removed from trench contacts, built in accordance with implementations of embodiments of the present disclosure.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
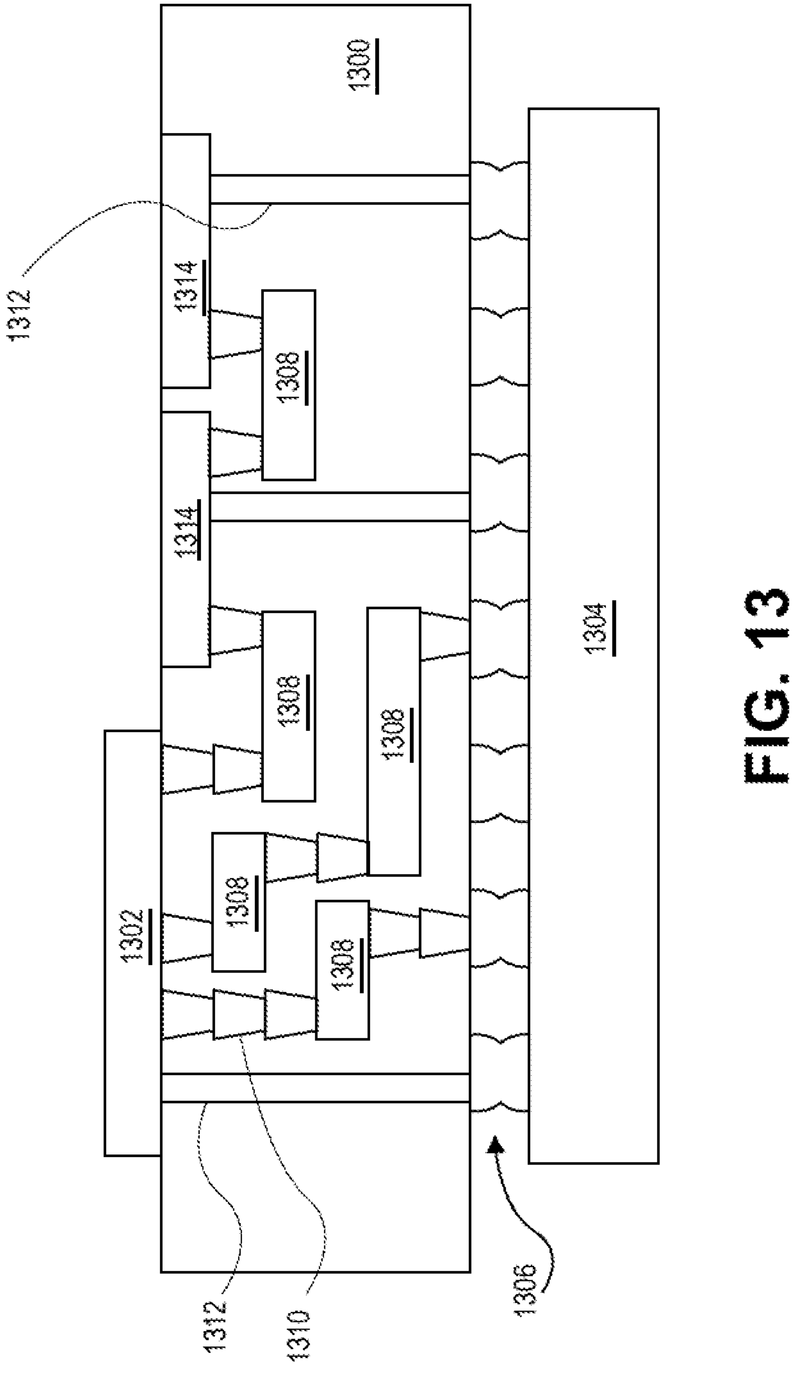
FIG. 13 illustrates an interposer that includes one or more embodiments of the disclosure.

FIG. 13 illustrates an interposer 1300 that includes one or more embodiments of the present disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die.

Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer 1300 may be formed of alternate rigid or flexible materials that may include the same materials described above for use in a semiconductor substrate, such as silicon, germanium, and other group III-V and group IV materials.

The interposer 1300 may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the disclosure, apparatuses or processes disclosed herein may be used in the fabrication of interposer 1300 or in the fabrication of components included in the interposer 1300.

Thus, embodiments of the present disclosure include integrated circuit structures having gate cut plugs removed from trench contacts, and methods of fabricating integrated circuit structures having gate cut plugs removed from trench contacts.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a vertical stack of horizontal nanowires. A gate electrode is over the vertical stack of horizontal nanowires. A conductive trench contact is adjacent to the gate electrode. A dielectric sidewall spacer is between the gate electrode and the conductive trench contact. A gate cut plug extends through the gate electrode and the dielectric sidewall spacer. The gate cut plug extends to and is conformal with a side of the conductive trench contact.

Example embodiment 2: The integrated circuit structure of example embodiment 1, wherein the gate cut plug extends to and is conformal with a non-flat side of the conductive trench contact.

Example embodiment 3: The integrated circuit structure of example embodiment 1 or 2, wherein the gate cut plug has a portion beneath the conductive trench contact.

Example embodiment 4: The integrated circuit structure of example embodiment 3, wherein the portion of the gate cut plug beneath the conductive trench contact has an angled top surface.

Example embodiment 5: The integrated circuit structure of example embodiment 1, 2, 3 or 4, further including an epitaxial source or drain structure at an end of the vertical stack of horizontal nanowires and beneath the conductive trench contact.

Example embodiment 6: An integrated circuit structure includes a fin. A gate electrode is over the fin. A conductive trench contact is adjacent to the gate electrode. A dielectric sidewall spacer is between the gate electrode and the conductive trench contact. A gate cut plug extends through the gate electrode and the dielectric sidewall spacer. The gate cut plug extends to and is conformal with a side of the conductive trench contact.

Example embodiment 7: The integrated circuit structure of example embodiment 6, wherein the gate cut plug extends to and is conformal with a non-flat side of the conductive trench contact.

Example embodiment 8: The integrated circuit structure of example embodiment 6 or 7, wherein the gate cut plug has a portion beneath the conductive trench contact.

Example embodiment 9: The integrated circuit structure of example embodiment 8, wherein the portion of the gate cut plug beneath the conductive trench contact has an angled top surface.

Example embodiment 10: The integrated circuit structure of example embodiment 6, 7, 8 or 9, further including an epitaxial source or drain structure at an end of the fin and beneath the conductive trench contact.

Example embodiment 11: A computing device includes a board, and a component coupled to the board. The component includes an integrated circuit structure including a vertical stack of horizontal nanowires. A gate electrode is over the vertical stack of horizontal nanowires. A conductive trench contact is adjacent to the gate electrode. A dielectric sidewall spacer is between the gate electrode and the conductive trench contact. A gate cut plug extends through the gate electrode and the dielectric sidewall spacer. The gate cut plug extends to and is conformal with a side of the conductive trench contact.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, wherein the component is a packaged integrated circuit die.

Example embodiment 15: The computing device of example embodiment 11, 12, 13 or 14, wherein the component is selected from the group consisting of a processor, a communications chip, and a digital signal processor.

Example embodiment 16: A computing device includes a board, and a component coupled to the board. The component includes an integrated circuit structure including a fin. A gate electrode is over the fin. A conductive trench contact is adjacent to the gate electrode. A dielectric sidewall spacer is between the gate electrode and the conductive trench contact. A gate cut plug extends through the gate electrode and the dielectric sidewall spacer. The gate cut plug extends to and is conformal with a side of the conductive trench contact.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, wherein the component is a packaged integrated circuit die.

Example embodiment 20: The computing device of example embodiment 16, 17, 18 or 19, wherein the component is selected from the group consisting of a processor, a communications chip, and a digital signal processor.

What is claimed is:

1. An integrated circuit structure, comprising:
a vertical stack of horizontal nanowires;
a gate electrode over the vertical stack of horizontal nanowires;
a conductive trench contact adjacent to the gate electrode;
a dielectric sidewall spacer between the gate electrode and the conductive trench contact; and
a gate cut plug extending through the gate electrode and the dielectric sidewall spacer, the gate cut plug extending to and conformal with a side of the conductive trench contact, wherein the gate cut plug has a portion beneath the conductive trench contact, and wherein the portion of the gate cut plug beneath the conductive trench contact has an angled top surface.

2. The integrated circuit structure of claim 1, wherein the gate cut plug extends to and is conformal with a non-flat side of the conductive trench contact.

3. The integrated circuit structure of claim 1, further comprising:
an epitaxial source or drain structure at an end of the vertical stack of horizontal nanowires and beneath the conductive trench contact.

4. An integrated circuit structure, comprising:
a fin;

a gate electrode over the fin;

a conductive trench contact adjacent to the gate electrode;

a dielectric sidewall spacer between the gate electrode and the conductive trench contact; and a gate cut plug extending through the gate electrode and the dielectric sidewall spacer, the gate cut plug extending to and conformal with a side of the conductive trench contact, wherein the gate cut plug has a portion beneath the conductive trench contact, and wherein the portion of the gate cut plug beneath the conductive trench contact has an angled top surface.

5. The integrated circuit structure of claim 4, wherein the gate cut plug extends to and is conformal with a non-flat side of the conductive trench contact.

6. The integrated circuit structure of claim 4, further comprising:

an epitaxial source or drain structure at an end of the fin and beneath the conductive trench contact.

7. A computing device, comprising:

a board; and a component coupled to the board, the component including an integrated circuit structure, comprising:

a vertical stack of horizontal nanowires;

a gate electrode over the vertical stack of horizontal nanowires;

a conductive trench contact adjacent to the gate electrode;

a dielectric sidewall spacer between the gate electrode and the conductive trench contact; and a gate cut plug extending through the gate electrode and the dielectric sidewall spacer, the gate cut plug extending to and conformal with a side of the conductive trench contact, wherein the gate cut plug has a portion beneath the conductive trench contact, and wherein the portion of the gate cut plug beneath the conductive trench contact has an angled top surface.

8. The computing device of claim 7, further comprising:

a memory coupled to the board.

9. The computing device of claim 7, further comprising:

a communication chip coupled to the board.

10. The computing device of claim 7, wherein the component is a packaged integrated circuit die.

11. The computing device of claim 7, wherein the component is selected from the group consisting of a processor, a communications chip, and a digital signal processor.

12. A computing device, comprising:

a board; and a component coupled to the board, the component including an integrated circuit structure, comprising:

a fin;

a gate electrode over the fin;

a conductive trench contact adjacent to the gate electrode;

a dielectric sidewall spacer between the gate electrode and the conductive trench contact; and a gate cut plug extending through the gate electrode and the dielectric sidewall spacer, the gate cut plug extending to and conformal with a side of the conductive trench contact, wherein the gate cut plug has a portion beneath the conductive trench contact, and wherein the portion of the gate cut plug beneath the conductive trench contact has an angled top surface.

13. The computing device of claim 12, further comprising:

a memory coupled to the board.

14. The computing device of claim 12, further comprising:

a communication chip coupled to the board.

15. The computing device of claim 12, wherein the component is a packaged integrated circuit die.

16. The computing device of claim 12, wherein the component is selected from the group consisting of a processor, a communications chip, and a digital signal processor.

* * * * *